US008199042B2

(12) United States Patent
Barrow et al.

(10) Patent No.: US 8,199,042 B2
(45) Date of Patent: Jun. 12, 2012

(54) APPARATUSES AND METHODS FOR PHYSICAL LAYOUTS OF ANALOG-TO-DIGITAL CONVERTERS

(75) Inventors: Jeffrey G. Barrow, Tucson, AZ (US); Benjamin O. Barrow, Tucson, AZ (US)

(73) Assignee: Integrated Device Technology, Inc., San Jose, CA (US)

( * ) Notice: Subject to any disclaimer, the term of this patent is extended or adjusted under 35 U.S.C. 154(b) by 94 days.

(21) Appl. No.: 12/766,737

(22) Filed: Apr. 23, 2010

(65) Prior Publication Data
US 2011/0210879 A1 Sep. 1, 2011

Related U.S. Application Data

(63) Continuation-in-part of application No. 12/714,042, filed on Feb. 26, 2010, now Pat. No. 8,085,180.

(51) Int. Cl.
*H03M 1/36* (2006.01)
(52) U.S. Cl. .................. 341/159; 341/135; 341/136
(58) Field of Classification Search .................. 341/156, 341/158, 159, 136
See application file for complete search history.

(56) References Cited

U.S. PATENT DOCUMENTS

| | | | |
|---|---|---|---|
| 4,270,118 A * | 5/1981 | Brokaw | 341/159 |
| 4,870,417 A | 9/1989 | van de Plassche et al. | |
| 5,157,397 A | 10/1992 | Vernon | |
| 5,420,587 A | 5/1995 | Michel | |
| 6,239,733 B1 | 5/2001 | Lin | |
| 6,628,224 B1 | 9/2003 | Mulder et al. | |
| 6,677,874 B1 * | 1/2004 | Mallinson | 341/136 |
| 6,891,494 B2 | 5/2005 | Choi | |

OTHER PUBLICATIONS

Pileggi et al., "Mismatch Analysis and Statistical Design at 65 nm and Below," IEEE 2008 Custom Integrated Circuits Conference (CICC), (2008) pp. 2-2-1 to 2-2-4.
Pelgrom et al., "Matching Properties of MOS Transistors," IEEE Journal of Solid State Circuits, vol. 24, No. 5, (Oct. 1989), pp. 1433-1440.

* cited by examiner

*Primary Examiner* — Khai M Nguyen
(74) *Attorney, Agent, or Firm* — Traskbritt PC

(57) ABSTRACT

Physical layouts of integrated circuits are provided, which may include an analog-to-digital converter including a plurality of comparators. Individual transistors of each comparator of the plurality are arranged in a one-dimensional row in a first direction. Neighboring comparators of the plurality of comparators are positioned relative to each other in an abutting configuration in a second direction orthogonal to the first direction. The plurality of comparators may include multiple, inter-coupled outputs. Such an ADC may be called a Benorion Analog-to-Digital Converter. A method for fabricating an integrated circuit is also provided. The method comprises arranging transistors of a first comparator in a one-dimensional row in a first direction, arranging transistors of at least one additional comparator in the one-dimensional row in the first direction, and arranging transistors of the first comparator and the at least one additional comparator relative to each other in a second direction orthogonal to the first direction.

28 Claims, 23 Drawing Sheets

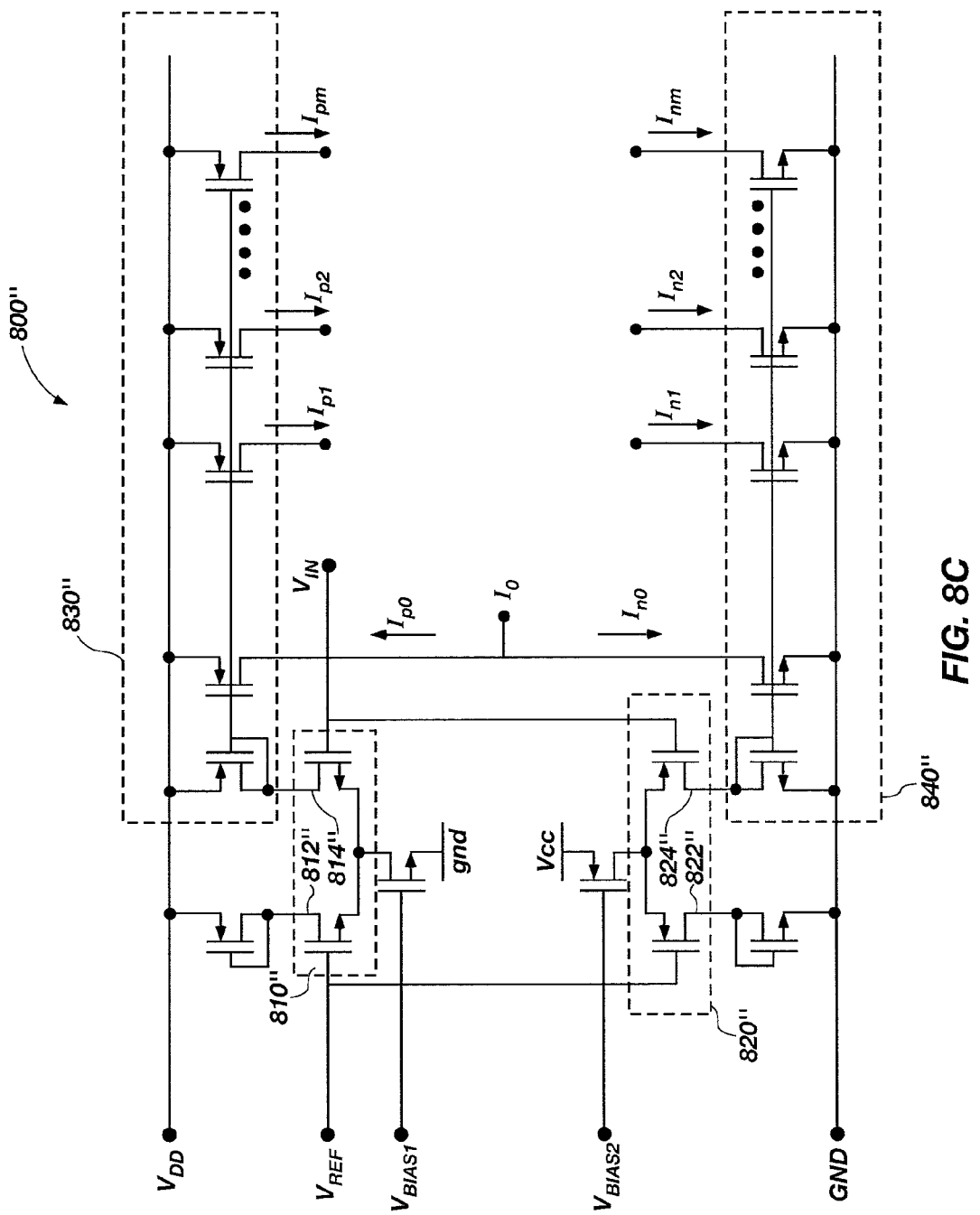

US 8,199,042 B2

APPARATUSES AND METHODS FOR PHYSICAL LAYOUTS OF ANALOG-TO-DIGITAL CONVERTERS

CROSS-REFERENCE TO RELATED APPLICATION

This application is a continuation-in-part of U.S. application Ser. No. 12/714,042, filed Feb. 26, 2010, now U.S. Pat. No. 8,085,180. The disclosure of the aforementioned patent application is incorporated by reference herein in its entirety.

TECHNICAL FIELD

Embodiments of the present disclosure relate generally to physical layouts of integrated circuits and, more particularly, to apparatuses and methods related to physical layouts related to comparators, analog-to-digital converters, multiple-output comparators and analog-to-digital conversion with multiple-output comparators.

BACKGROUND

An analog-to-digital converter (ADC) is an important electronic building block that links real-world signals to the powerful capabilities of digital processing. Because analog signals may vary so widely over amplitude, frequency, and other requirements, a multitude of different ADC architectures have been developed. ADCs may be configured based on certain desired end-user application requirements, such as resolution, dynamic range, conversion rate, integral and differential linearity, power dissipation, accuracy, bandwidth, conversion delay, cost, package pin count, supply voltage range, or many other characteristics related to performance of the ADC. Desired end-user application requirements may be matched with an ADC's characteristics to achieve an appropriate conversion solution.

Different ADCs may be suitable for a particular problem set. For example, conventional flash ADCs may be relatively fast and therefore suitable for high-speed signals, such as in applications where the ADC is part of a high-speed closed loop system where small conversion delay is needed in the feedback path for digital processing and control. One disadvantage of conventional flash ADCs is that they may consume relatively high power. Additionally, conventional flash ADCs may be limited to bipolar junction transistor (BJT) technologies because of transistor mismatch errors, as will be explained herein. Because most conventional flash ADCs are based on BJT technology, the die size (i.e., footprint) of the conventional flash ADC may be relatively large and can be relatively expensive to manufacture.

Other ADC configurations may be suited for different applications. For example, successive-approximation ADCs operate by comparing the input voltage to the output of an internal digital-to-analog converter (DAC) until the best approximation is achieved. Successive-approximation ADCs may cure some of the deficiencies of the conventional flash ADC in that the successive-approximation ADC may be manufactured using advanced CMOS technologies, thus reducing the amount of silicon area consumed; however, the conversion rates for successive-approximation ADCs are an inverse function of resolution. Therefore, successive-approximation ADCs may not be suitable for applications that require fast conversion, but may be desirable for applications requiring small die size, for which conversion rate is of lesser importance.

Integrating ADCs apply an input voltage to the input of an integrator in order to ramp until the input integrator output returns to zero. Like the successive-approximation ADC, integrating ADCs can have high resolution, but are also relatively slow. However, one advantage of the integrating ADC is low power dissipation. Therefore, integrating ADCs may be desirable when low power dissipation is an important parameter, but conversion rate is not. Other ADC configurations exist that are not described herein, each configuration with advantages and disadvantages that may influence the selection of the ADC for a particular application. As an example, a configuration of a conventional flash ADC will be described for illustrative purposes.

FIG. 1 illustrates a simplified block diagram for a conventional flash analog-to-digital converter 100. Conventional flash ADC 100 includes a comparator string 110, a resistor string 120, and a decoder 130. Resistor string 120 includes individual resistors (R) connected in series between voltage references $V_{REF1}$ and $V_{REF2}$. The comparator string 110 includes individual comparators (Cp) in series in which one input to each individual comparator (Cp) of the comparator string 110 is operably coupled to an analog input signal $V_{IN}$, and another input to each individual comparator (Cp) is operably coupled to intermediate voltage references located at nodes between the individual resistors (R) of the resistor string 120. Analog input signal $V_{IN}$ may simply be referred to herein as "$V_{IN}$." The outputs from each individual comparator (Cp) of the comparator string 110 are operably coupled to a decoder 130, which generates a digital output signal 135. Code block 125 is illustrated for ease of description and will be discussed later.

The number of resistors in the resistor string 120 is $2^N$, where "N" refers to the resolution (i.e., number of bits) of the ADC. The number of individual comparators (Cp) in the comparator string 110 is $2^N-1$. For example, a 6-bit flash ADC has 64 resistors and 63 comparators. Likewise, an 8-bit flash ADC has 256 resistors and 255 comparators, and so on. The intermediate voltage references between serially connected resistors, and input into one of the individual comparators (Cp) of the comparator string 110, are one less significant bit (LSB) greater than the reference voltage for the comparator below it. As used in the context of outputs (i.e., codes) and voltage references, LSB refers to the voltage references input into the comparator string 110, which translates into a corresponding code output from an individual comparator (Cp) of the comparator string 110. Later in this discussion, LSB may be referred to as a specific voltage level, which is intended to refer to the difference between adjacent voltage reference signals input into the comparator string 110.

In operation, when $V_{IN}$ is applied, each individual comparator (Cp) in the comparator string 110 compares $V_{IN}$ with the voltage reference signal corresponding to the particular individual comparator (Cp). If $V_{IN}$ increases to a level above the voltage level of the voltage reference signal of a particular individual comparator (Cp), then the output of the particular individual comparator (Cp) is asserted (e.g., 1). If $V_{IN}$ is at a voltage level below the voltage level of the voltage reference signal of a particular individual comparator (Cp), then the output of the particular comparator (Cp) is not asserted (e.g., 0). The code block 125 merely represents the state (e.g., asserted, not asserted) of the outputs (i.e., codes) of the individual comparators (Cp). While there may be additional circuitry or other components between the comparator string 110 and decoder 130, code block 125 itself should not be viewed as a physical component.

For this example, it is assumed that $V_{REF1}$ is greater than $V_{REF2}$, and that the intermediate voltage references between $V_{REF1}$ and $V_{REF2}$ decrease from $V_{REF1}$ to $V_{REF2}$ such that the outputs near the bottom of conventional flash ADC 100 are asserted first as $V_{IN}$ increases. The code block 125 may be thought of as the number of codes being asserted rises as voltage level of $V_{IN}$ increases, in a manner similar to a thermometer rising as temperature rises.

In FIG. 1, code block 125 illustrates the outputs from the bottom four individual comparators (Cp) to be asserted while the outputs from the top four individual comparators (Cp) are not asserted, indicating that $V_{IN}$ is at a voltage level greater than the voltage reference signals to the bottom four individual comparators (Cp) and lesser than the voltage reference signals to voltage reference signals to the top four individual comparators (Cp). The decoder 130 includes internal logic that converts the codes from the code block 125 into a digital output signal 135.

Individual comparators (Cp) in comparator string 110 of a conventional flash ADC 100 are generally configured using BJTs for reasons that will be discussed. A conventional flash ADC 100 may take advantage of BJTs comparatively good matching properties and relatively high transconductance for desirable comparator performance for certain applications. However, even the smallest BJTs may be relatively large (in comparison to other processes such as CMOS) and may consume considerable silicon area, thereby resulting in relatively large components and high manufacturing cost. Additionally, BJTs draw a parasitic base current through the resistor string 120 resulting in an accumulation of error that reduces accuracy. Designers may construct the resistor string 120 from metal such as aluminum, gold, or copper in an attempt to reduce the resulting error caused by this parasitic base current. However, a tradeoff may result as a low value resistance between $V_{REF1}$ to $V_{REF2}$ also results in high current flow through resistor string 120, and therefore may adversely contribute to power dissipation.

The combination of $2^N$ BJT base terminals on a single $V_{IN}$ node also contributes to a large parasitic input capacitance. This parasitic input capacitance may be undesirable because a flash ADC is often used in high frequency applications. To achieve certain desired performance, BJTs may be biased with large bias current, which may range from approximately 100 microamps to several milliamps. For a successive-approximation ADC, where a single comparator is used over and over, such a large bias current may not result in significant problems; however, in a flash ADC, the parallel construction of the individual comparators (Cp) multiplies the large bias current by the resolution of the ADC. Because BJT performance drops when in saturation, the supply voltage range may be required to be sufficiently large enough for operation in the active region. This supply voltage (e.g., 5 V or higher) multiplied by the large bias current (e.g., 100s of mA) may result in an undesirably high power dissipation.

Despite the less desirable characteristics of the conventional flash ADC 100 discussed above, the flash ADC with BJTs remains the primary choice of designers for high frequency analog-to-digital conversion. Mere substitution of the BJTs in the comparators of comparator string 110 for submicron CMOS technology in a flash comparator may have relatively high speed, low power, low input capacitance, and low cost because of the smaller footprint; however, problems associated with transistor matching between CMOS transistors may be too great in comparison with matching between BJT transistors (see Table 1 below). The undesired mismatch may cause unacceptable differential non-linearity (DNL) errors. The DNL errors may be so large that entire codes may become missing or misplaced.

FIGS. 2A-2C show graphs illustrating various outputs 200, 225, 250 of a conventional flash analog-to-digital converter. For example, FIG. 2A illustrates an ideal output of a conventional flash ADC as $V_{IN}$ increases linearly from a low voltage to a high voltage. Codes 1 through "m" correspond to outputs of the comparator string, which are input into a decoder. FIG. 2B illustrates outputs of a conventional flash ADC as $V_{IN}$ increases linearly from a low voltage to a high voltage, in which one code (code j) experiences a DNL error. FIG. 2C illustrates outputs of a conventional flash ADC as $V_{IN}$ increases linearly from a low voltage to a high voltage, in which one code (code j) is missing or is misplaced. Each of the "misbehaving" (i.e., acts differently) bits may be a result of transistor mismatch from one of the many transistors of the conventional flash ADC (e.g., transistors in the comparators, load transistors, etc.). Because mismatch is greater in CMOS transistors in comparison to BJTs, these errors caused by the misbehaving bits illustrated by FIGS. 2B and 2C are more likely to occur.

FIGS. 3A and 3B illustrate configurations of comparators 300, 350, such as those used in a comparator string of a conventional flash analog-to-digital converter, using BJT and CMOS processes, respectively. FIG. 3A illustrates a comparator 300 according to a BJT process. FIG. 3B illustrates a comparator 350 according to a CMOS process. In both cases, the comparators 300, 350 are configured such that an output voltage at node $V_{OUT}$ is low when $V_{IN}$ is greater than $V_{REF}$. However, the differences in comparators 300, 350 will be highlighted during the discussion below.

Those skilled in the art may be aware that increased gate area improves CMOS matching. For example, transistor matching in CMOS processes can be approximated by simplified Pelgrom's equations for variance ($\sigma^2(\Delta P)$) and standard deviation ($\sigma(\Delta P)$) for a process parameter P (e.g., voltage) between two circuit elements:

$$\sigma^2(\Delta P) \approx AP^2/WL \rightarrow \sigma(\Delta P) \approx AP/\sqrt{(WL)} \quad (1).$$

Therefore, transistor matching is inversely proportional to the square root of gate area (WL). For improved transistor matching, the standard deviation $\sigma(\Delta P)$ should be minimized for improved DNL errors. However, improving transistor matching may cause degradation to conversion speed. In order to avoid degrading conversion speed, the following analysis guides the transistor design geometry.

Conversion speed (T) can be approximated by gate capacitance (C) multiplied by channel resistance (R). Gate capacitance is approximated as $C \approx \mathcal{E}WL/tox$. Channel resistance is approximated by $R \approx \rho L/W$. Therefore, conversion speed is $T = RC \approx \rho L/W * \mathcal{E}WL/tox = \rho \mathcal{E}L^2/tox$. Conversion speed may be written as:

$$T \approx \beta L^2, \text{where } \beta = \rho \mathcal{E}/tox \quad (2).$$

Conversion speed (T) is, therefore, proportional to the square of the gate length (L) and may not be a function of gate width (W). For the fastest speed, design goals may include minimizing the conversion speed (T) for high-speed operation by using the smallest possible gate length (L). Therefore, conversion speed and DNL can be managed independently. An improved (i.e., reduced) conversion speed (T) with a suitable DNL may be achieved by making gate length (L) small and gate width (W) large. Gate length (L) and width (W) can be independently chosen to improve both speed and matching. For example, an NMOS transistor may have a standard deviation of 30 mV for a 0.18 μm×0.8 μm gate in a CMOS process. A PMOS transistor may have a standard deviation of 40 mV for a 0.18 μm×0.8 μm gate in a CMOS process. A basic, conventional comparator used in a conventional flash ADC may have four NMOS and two PMOS transistors.

$$\sigma = \sqrt{(\sigma n^2 + \sigma n^2 + \sigma n^2 + \sigma n^2 + \sigma p^2 + \sigma p^2)} = \sqrt{[4(30^2) + 2(40^2)]} = 82.5 \text{ mV} \quad (3).$$

As a further example, 1 LSB may equal about 6 mV. In that case, a minimum geometry design such as the one listed above may produce 14 LSB code misplacements. As another example, 1 LSB=6 mV and the design goal is to reduce DNL (i.e., transistor matching, standard deviation) to be about ½ A LSB (i.e., 3 mV). In this example, the required gate width (W) may be solved by Pelgrom's Equation for standard deviation:

$$3 \text{ mV} = \sigma = \sqrt{[4A_nP^2/(WL) + 2A_pP^2/(WL)]} \approx 60/\sqrt{W} \quad (4).$$

$A_nP$ and $A_pP$ are the proportionality constants for the NMOS and PMOS transistors, respectively, and are assumed to be 10 mV and 12 mV, respectively in this example. It is noted that $A_nP$ and $A_pP$ are process and foundry dependent parameters; however, for the values given above are used in 0.18 μm CMOS processes, which is used as an example herein. Therefore, when solving for gate width (W), the gate width (W) is required to be approximately 400 μm wide for a ½ LSB DNL if the LSB is 6 mV for a conventional flash ADC using 0.18 μm gate length CMOS transistors. This transistor size is relatively very large and consumes a very large silicon area.

In other words, gate width (W) can be increased to improve comparator matching without degrading AC performance or decreasing the available linear range for combining adjacent comparator outputs. However, an increase in gate width (W) causes the current to proportionally increase to maintain the AC performance. For example, to maintain proper bias, each transistor may operate at a much higher operating current than a minimum geometry transistor (e.g., 0.18 μm×0.8 μm). Increasing the operating current may also increase the power dissipated by the conventional flash ADC by an undesirable amount. Thus, increasing gate width (W) to improve linearity has a power and die-size disadvantage. Consequently, a conventional flash ADC constructed using sub-micron CMOS transistors may be impractical.

Table 1, shows typical mismatch and DNL errors for different transistor types.

TABLE 1

| Transistor Type | Typical Mismatch | DNL Error w/6 mV LSB |
| --- | --- | --- |
| NPN-BJT | <2 mV | ⅓ LSB |
| NMOS 0.18 um × 0.8 um | 30 mV | 5 LSB |
| NMOS 1 um × 1 um | 9 mV | 1.5 LSB |
| PMOS 0.18 um × 0.8 um | 40 mV | 7 LSB |
| PMOS 1 um × 1 um | 12 mV | 2 LSB |

In Table 1, it should be noted that 1σ matching when the LSB is 6 mV for the BJT design is about ⅓ LSB, while for the CMOS design 1σ matching may be as high as 7 LSBs. Given that an 8-bit converter has 255 parallel comparators, it may be reasonable to expect 3σ or higher variation, therefore a conventional flash ADC with 0.18 μm CMOS transistors may reasonably be expected have a few codes with greater than 21 LSBs of code misplacement error. Therefore, construction of a conventional flash ADC with sub-micron, minimum geometry CMOS transistors may not meet many application requirements.

Table 2 illustrates a side-to-side comparison between conventional BJT and CMOS flash ADC design. As seen in Table 2, BJTs have a lower standard deviation and DNL than a CMOS transistor. For this reason, and those described above regarding CMOS processes, BJT processes are generally used for conventional flash ADCs. However, as shown by Table 2, BJTs may have undesirable characteristics in comparison with CMOS including, higher power dissipation, larger silicon consumption and increased cost, and a lack of mixed signal monolithic capability.

TABLE 2

| Parameter | BJT | CMOS |
| --- | --- | --- |
| DNL | 2 mV | 30 mV |
| Power Dissipation | High Power | Lower Power |
| Cost | High Cost | Low Cost |
| Conversion Rate | Fast | Fast |
| Mixed Signal Monolithic Compatibility | No | Yes |

Integrated circuit (IC) layout is the design step after electrical simulation where an electrical schematic, made of abstract symbols, is realized into a physical representation. For example, by drawing polygon shapes for multiple process step layers, the image of a physical, electrical device (e.g., transistor, resistor, etc.) is portrayed enabling the construction of a specialize set of tools, called a mask set. The mask set may be used by an IC fabrication facility to construct the actual, physical electrical components.

FIG. 3C illustrates another conventional comparator 370, in which the transistors are configured such that an output voltage $V_{OUT}$ is low when $V_{IN}$ is greater than $V_{REF}$. Conventional comparator 370 includes a latch. Physical layouts of a circuit generally mirror the general shape and layout shown by the schematic representations of the circuit. In other words, layout engineers generally may make the physical layout of a circuit look like the symbolic representation (e.g., conventional comparator 370) of the circuit. This may be primarily a result of the schematic being a representation of how the signals flow through the circuit, which may also provide for simplicity in the interconnections within the circuit.

As an example, the conventional comparator 370 has transistors represented in the X and Y directions. Conventionally, a physical layout of the transistors would be configured and oriented in the X and Y directions. Similarly, physical layouts for the comparators 300, 350 of FIGS. 3A and 3B may also conventionally mirror the schematic representations of the circuit. As a result, the conventional layouts for an individual comparator (e.g., 300, 350, 370) has transistors that are positioned in both the X and Y directions.

When multiple comparators are used to form a conventional flash ADC (FIG. 1), the physical layouts for the individual comparators (e.g., 300, 350, 370) may be repeated (e.g., Y direction) to form the comparator string for the ADC according to the desired resolution of the comparator. If the plurality of comparators are repeated to construct the comparator string, there may be regions of wasted space between comparators. Such regions of wasted space may increase the footprint and the cost of the resulting die. While this example is used for comparators and flash ADCs, other individual components that are conventionally constructed in both the X and Y directions may similarly experience wasted space when the individual component is repeated to form a larger circuit.

The inventor has appreciated that there exists a need for a method and apparatus for analog-to-digital conversion which may include one or more of the following parameters: relatively fast conversion rate, low conversion latency (i.e., propagation delay), low cost, low input bias current, low input capacitance and low power dissipation, which may improve upon some of the limitations of conventional ADCs, including conventional bipolar junction flash ADCs, successive-approximation ADCs and integrating ADCs. The inventor has further appreciated that there is a need for a physical layout of an ADC which may reduce the die size, and which may further improve matching characteristics between comparators.

BRIEF SUMMARY OF THE INVENTION

Embodiments of the present invention include a physical layout for an integrated circuit. The integrated circuit comprises an analog-to-digital converter including a plurality of comparators. Individual transistors of each comparator of the plurality are arranged in a one-dimensional row in a first direction. Neighboring comparators of the plurality are positioned relative each other in an abutting configuration in a second direction orthogonal to the first direction.

Another embodiment of the present invention includes a physical layout of an integrated circuit. The integrated circuit comprises a plurality of rows of transistors forming a two-dimensional array of transistors. Each of the plurality of rows includes transistors arranged in a one-dimensional row in a first direction. Each of the individual rows of transistors are configured to perform a comparator function of an input signal and a reference signal.

In yet another embodiment of the present invention, a method for fabricating an integrated circuit is provided. The method comprises arranging transistors of a first comparator in a one-dimensional row in a first direction, arranging transistors of at least one additional comparator in the one-dimensional row in the first direction, and arranging transistors of the first comparator and the at least one additional comparator relative to each other in a second direction orthogonal to the first direction.

BRIEF DESCRIPTION OF THE SEVERAL VIEWS OF THE DRAWINGS

FIGS. 8A-8D illustrate various examples of comparators with a single input and multiple outputs according to an embodiment of the present invention;

DETAILED DESCRIPTION

Figure 1:
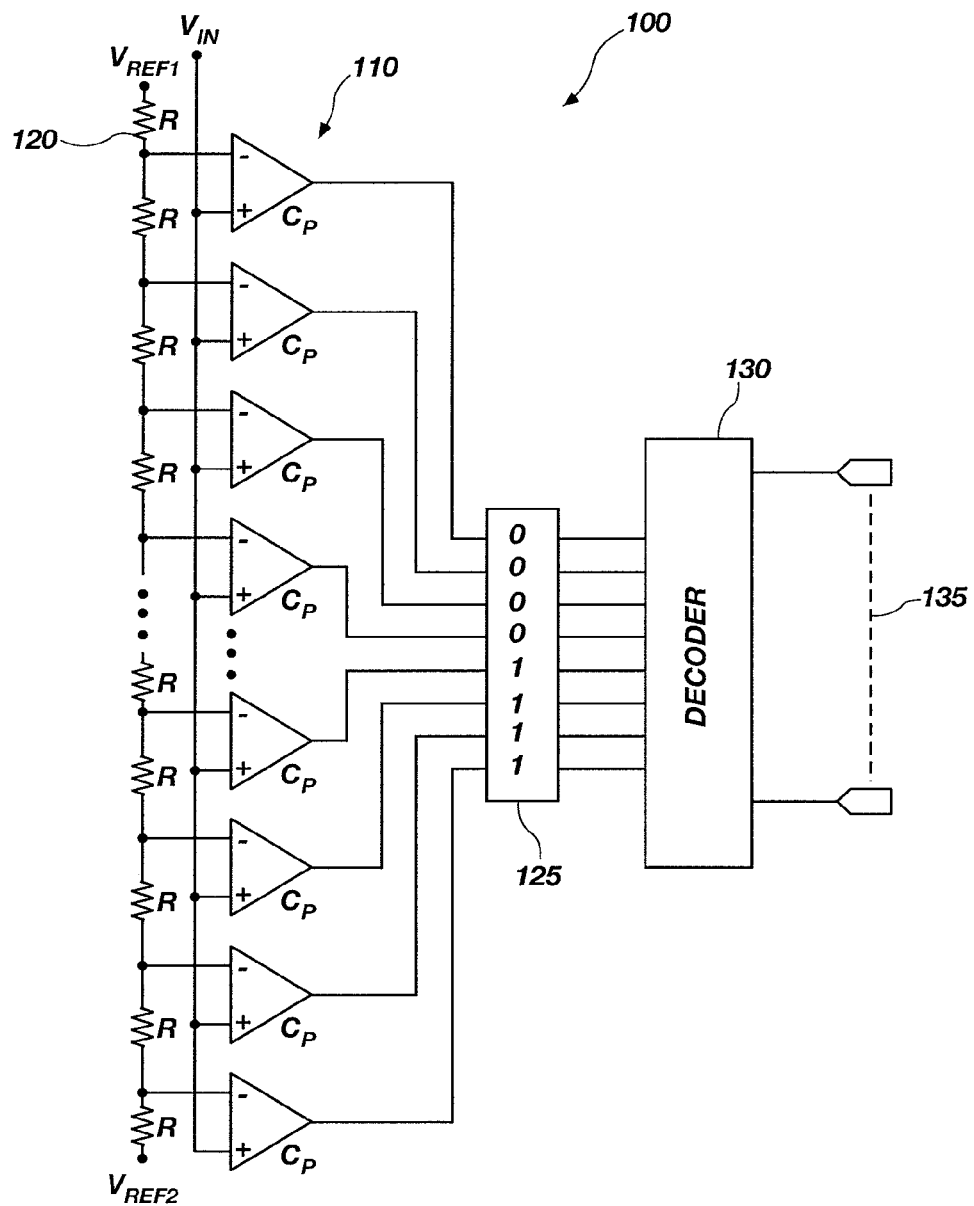
FIG. 1 illustrates a simplified block diagram for a conventional flash analog-to-digital converter.
Figure 2A:
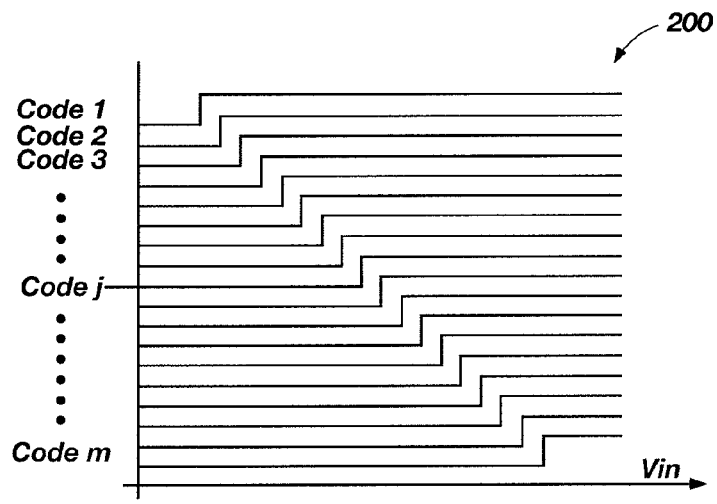
FIGS. 2A-2C show graphs illustrating various outputs of a conventional flash analog-to-digital converter.
Figure 2B:
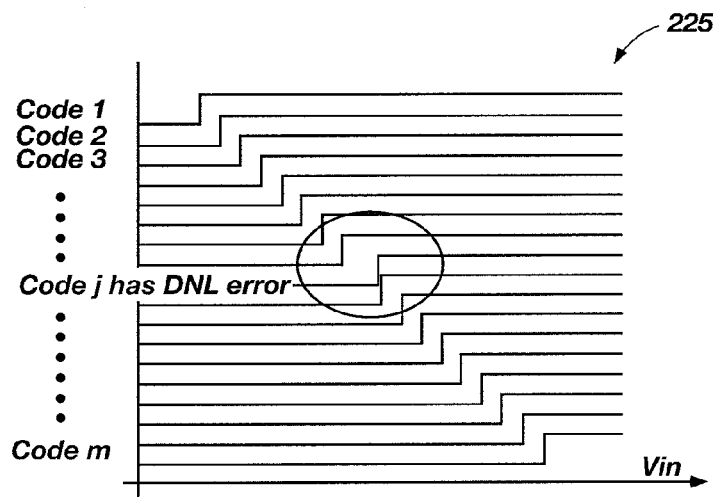
Figure 2C:
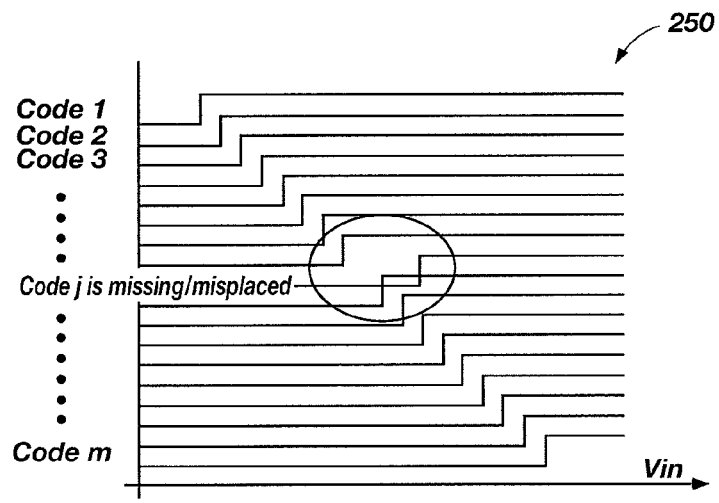

Embodiments of the present disclosure include apparatuses and methods for comparing two signals, for analog-to-digital conversion, and in which a new ADC is introduced. This new ADC may be called a Benorion ADC or Benorion Converter. The term "Benorion" is intended to be used as a title for a new type of converter. Benorion has not previously been used in ADCs and should not be interpreted to have any prior meaning or functionality not related to that which is described herein through the various examples, as defined in the claims, and by their legal equivalents.

In the following description, elements, circuits, and functions may be shown in block diagram form in order not to obscure the present invention in unnecessary detail. Conversely, specific implementations shown and described are exemplary only and should not be construed as the only way to implement the present invention unless specified otherwise herein. Additionally, block definitions and partitioning of logic between various blocks is exemplary of a specific implementation. It will be readily apparent to one of ordinary skill in the art that the present invention may be practiced by numerous other partitioning solutions. For the most part, details concerning timing considerations and the like have been omitted where such details are not necessary to obtain a complete understanding of the present invention and are within the abilities of persons of ordinary skill in the relevant art.

Furthermore, in this description of embodiments of the invention, reference is made to the accompanying drawings which form a part hereof, and in which is shown, by way of illustration, specific embodiments in which the invention may be practiced. The embodiments are intended to describe aspects of the invention in sufficient detail to enable those skilled in the art to practice the invention. Other embodiments may be utilized and changes may be made without departing from the scope of the present invention. The following detailed description is not to be taken in a limiting sense, and the scope of the present invention is defined only by the appended claims.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal for clarity of presentation and description. It will be understood by a person of ordinary skill in the art that the signal may represent a bus of signals, wherein the bus may have a variety of bit widths and the present invention may be implemented on any number of data signals including a single data signal.

Those of skill would further appreciate that the various illustrative logical blocks, modules, circuits, and algorithm acts described in connection with embodiments disclosed herein may be implemented as electronic hardware, computer software, or combinations of both. To clearly illustrate this interchangeability of hardware and software, various illustrative components, blocks, modules, circuits, and steps are described generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the embodiments of the invention described herein.

It should be understood that any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. Also, unless stated otherwise a set of elements may comprise one or more elements.

Figure 4A:
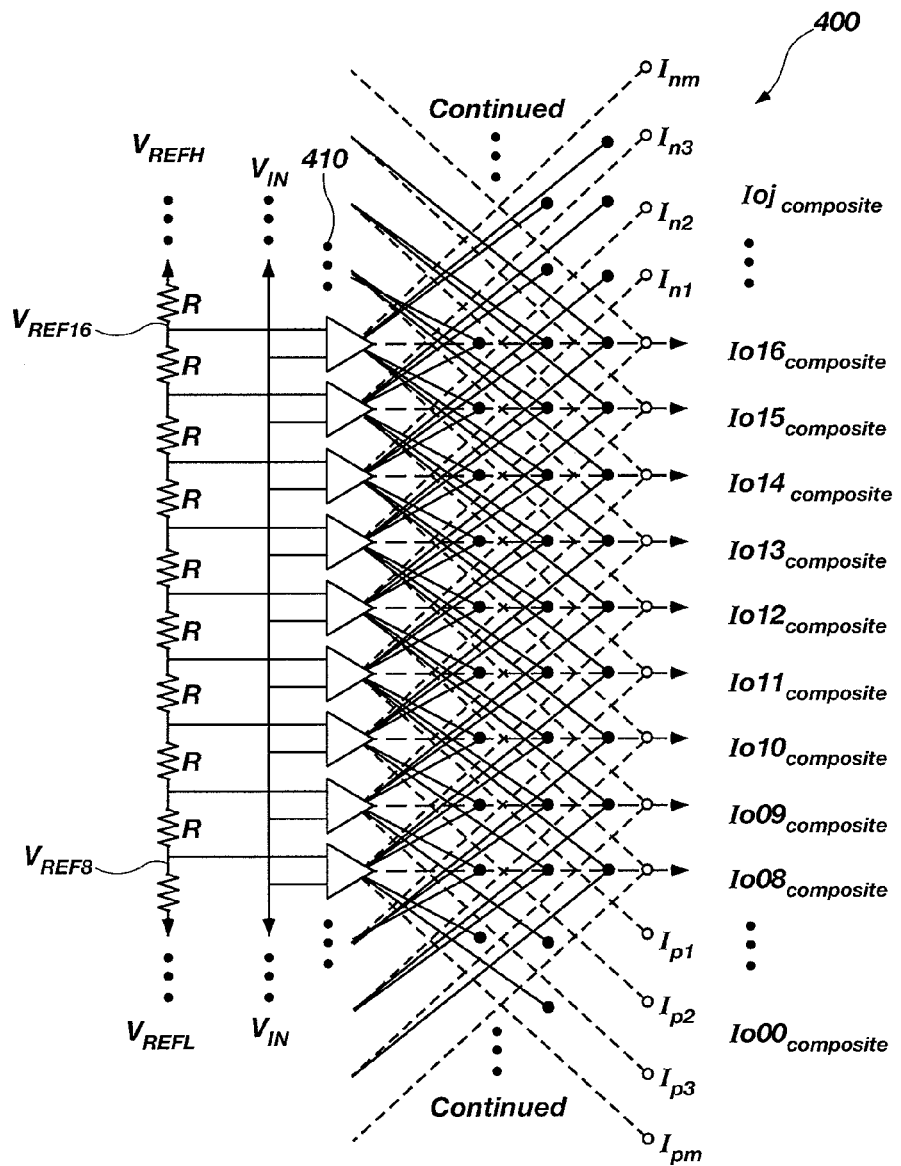
FIG. 4A illustrates an analog-to-digital converter according to an embodiment of the present invention.

FIG. 4A illustrates an analog-to-digital converter 400 according to an embodiment of the present invention. Analog-to-digital converter 400 includes a comparator string 410 with a plurality of comparators. Each of the individual comparators (Cp) in the comparator string 410 receives as inputs an analog input signal $V_{IN}$ and a voltage reference signal $V_{REFX}$. The different voltage reference signals $V_{REFX}$ may be generated within a resistor string 420. The "x" is an index referring to a number of a specific voltage reference signal (e.g., $V_{REF8}$, $V_{REF16}$). The resistor string 420 may include individual resistors (R) operably coupled in series between a high voltage reference signal $V_{REFH}$ and a low voltage reference signal $V_{REFL}$. For a resistor string 420 there may generally be one resistor for every LSB that generates a voltage reference signal $V_{REFX}$ for an input to an individual comparator (Cp) of the comparator string 410 to be compared with $V_{IN}$ at the other input of the individual comparator (Cp) of the comparator string 410. Although intermediate voltage references (e.g., $V_{REF8}$-$V_{REF16}$) are shown herein as being generated at nodes along the resistor string 420 between high and low voltage reference signals $V_{REFH}$, $V_{REFL}$, other resistor or circuit configurations may likewise generate voltages reference signals $V_{REFX}$ to be compared to $V_{IN}$ by individual comparators (Cp) of comparator string 410.

Each of the individual comparators (Cp) in the comparator string 410 compares $V_{IN}$ with a voltage reference signal $V_{REFX}$ to generate a plurality of output signals (i.e., codes). Outputs from the individual comparators (Cp) of the comparator string 410 are coupled with at least one other output from another individual comparator (Cp). The combination of inter-coupled output signals forms a set of composite output signals $Ion_{composite}$. For example, the eight individual comparators (Cp) shown in comparator string 410 in FIG. 4A have cross-coupled outputs (shown generally being output by each comparator and extending in both directions labeled $I_{N1}$-$I_{NM}$ and $I_{P1}$-$I_{PM}$) to generate composite outputs (e.g., $Io08_{composite}$ to $Io16_{composite}$). More or fewer composite outputs may be generated as is indicated by $Io00_{composite}$ and $Ioj_{composite}$ shown on each end of the composite output string.

Individual comparators (Cp) compare a single input (e.g., $V_{IN}$) with a voltage reference signal $V_{REFX}$ in a 1-dimensional manner. However, because individual comparators (Cp) have multiple outputs coupled with outputs from neighboring individual comparators (Cp), a second dimension of analog-to-digital conversion may be achieved. For example, if the transconductance of each individual comparator (Cp) is low enough for the outputs of neighboring interconnected individual comparators (Cp) to overlap in the linear region, then the collective response on a single composite output node determines a quasi analog-to-digital conversion. Therefore, if each of the individual comparators (Cp) is monotonic relative to neighboring comparators, any variance in a single bit (i.e., composite output signal) moves in a complimentary way relative to the neighboring bits, thus reducing or eliminating missing codes. For example, if a single bit misbehaves relative to the other bits, by cross-coupling the outputs of the individual comparators (Cp) and summing the output signals together, the bits that are behaving properly may overpower the misbehaving bit. However, it should be noted that if all bits were to be off from normal operation, but were off in a manner similar to each of the bits, then each bit may maintain this monotonic behavior as each bit is averaged relative to the behavior of the neighboring bits. Thus, a misbehaving and a properly behaving bit may be viewed in light of the bit's behavior relative to the behavior of the neighboring bits.

Figure 4B:
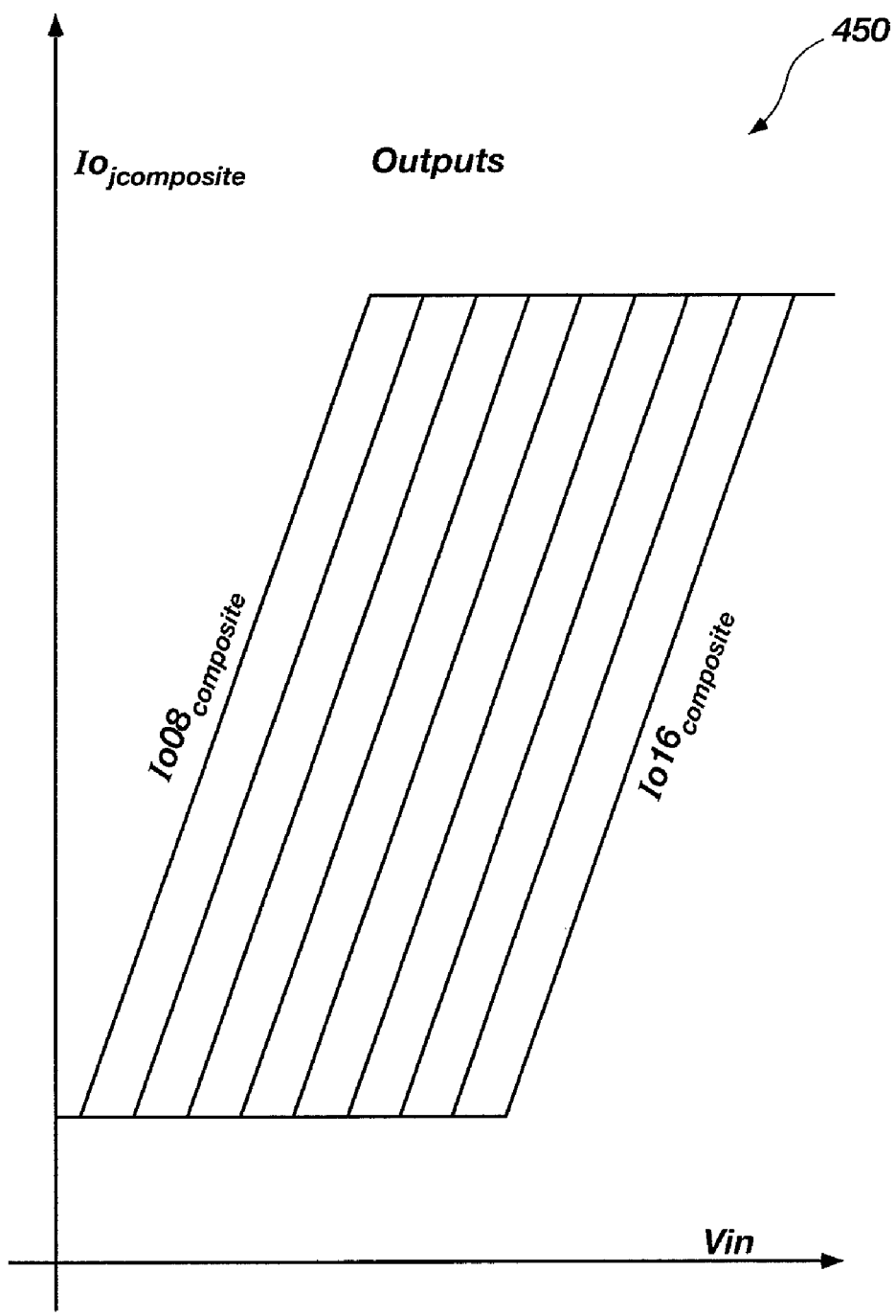
FIG. 4B illustrates a graph showing the composite output currents for the ADC from FIG. 4A according to an embodiment of the present invention.

FIG. 4B illustrates a graph 450 showing the composite outputs $Io08_{composite}$ to $Io16_{composite}$ for the ADC 400 from FIG. 4A according to an embodiment of the present invention. As $V_{IN}$ increases, the different composite outputs become asserted to generate a quasi-digital code. Because outputs from the individual comparators (Cp) of the comparator string 410 are coupled with at least one other output from another individual comparator (Cp), the composite outputs maintain a monotonic relationship relative to the other composite outputs.

Figure 5:
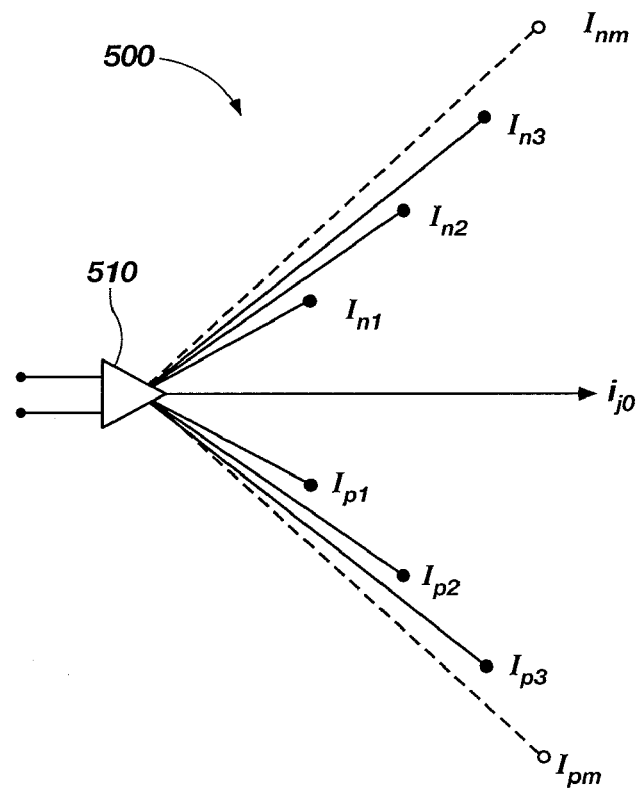
FIG. 5 shows an equivalent schematic diagram for a multiple-output comparator according to an embodiment of the present invention.

FIG. 5 shows an equivalent schematic diagram for a multiple-output comparator 500 according to an embodiment of the present invention. Multiple-output comparator 500 may be used as a comparator in a Benorion ADC. Multiple-output comparator 500 includes a comparator 510 that receives a single input (e.g., $V_{IN}$) to compare with a voltage reference (e.g., $V_{REF}$). Comparator 510 is configured to generate output signals responsive to the relationship of $V_{IN}$ and $V_{REF}$. For example, a primary output current (e.g., $I_{j0}$) is generated when $V_{IN}$ is greater than $V_{REF}$. Comparator 510 includes a plurality of additional output currents (e.g., $I_{n1}$-$I_{nm}$, $I_{p1}$-$I_{pm}$). These additional output currents may be coupled with outputs from other individual comparators in a comparator string (e.g., in an ADC) to generate composite outputs. Additionally, output current $I_{j0}$ may combine with other additional outputs from other individual comparators in a comparator string to generate a composite output.

Figure 6:
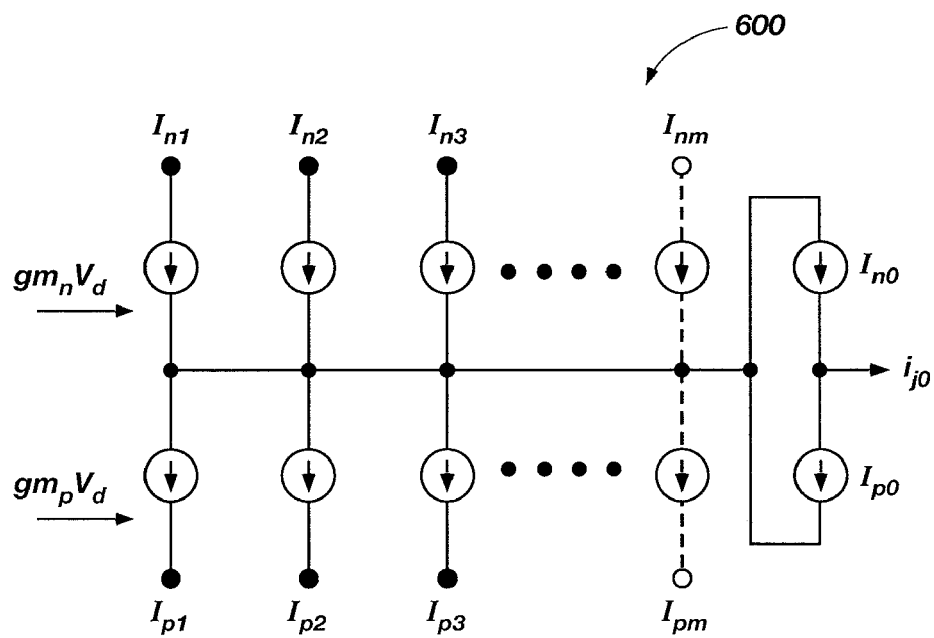
FIG. 6 shows an equivalent schematic diagram of output currents for a multiple-output comparator according to an embodiment of the present invention.

FIG. 6 shows an equivalent schematic diagram of output currents for a multiple-output comparator 600 according to an embodiment of the present invention. Multiple-output comparator 600 may be used as a comparator in a Benorion ADC. Multiple-output comparator 600 generates a primary output current (e.g., $I_{j0}$). Multiple-output comparator 600 includes a plurality of additional output currents (e.g., $I_{n1}$-$I_{nm}$, $I_{p1}$-$I_{pm}$). These additional output currents may be coupled with outputs from other individual comparators in a comparator string (e.g., in an ADC) to generate composite outputs. Additionally, primary output current $I_{j0}$ may combine with other additional outputs from other individual comparators in a comparator string to generate a composite output.

As shown in FIG. 6, some of the additional output currents may be positive currents and some additional outputs may be negative currents. The primary output current may be a combination of a positive and a negative current (e.g., $I_{p0}$ and $I_{n0}$ as shown in FIG. 6). When implemented in an ADC, the additional output currents ($I_{n1}$-$I_{nm}$, $I_{p1}$-$I_{pm}$) may be operatively coupled with other output currents (e.g., other primary output currents, additional output currents from other comparators, or any combination thereof). These inter-coupled output currents may be summed with each other in order to generate a composite output current for each output code. For example, a positive current on one side of the composite output code is averaged by negative current on the other side of the composite output code.

Figure 7:
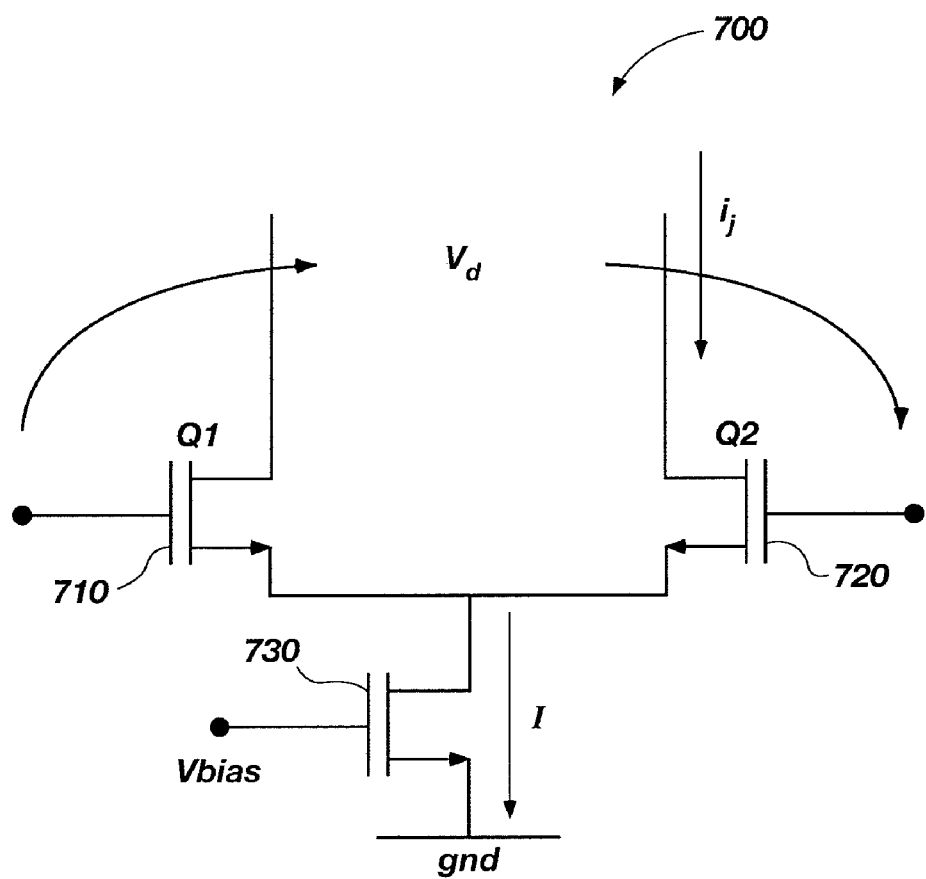
FIG. 7 illustrates a simplified differential amplifier, which may be used in an ADC according to an embodiment of the present invention.

FIG. 7 illustrates a simplified differential amplifier 700, which may be used in an ADC according to an embodiment of the present invention. Simplified differential amplifier 700 may be used as a comparator in a comparator string of an ADC. Because amplifiers may be configured as comparators, the terms "amplifier" and "comparator" may be used interchangeably in this, and other embodiments. Simplified differential amplifier 700 includes a NMOS transistor 710 and a NMOS transistor 720 coupled to each other such that the sources of the NMOS transistor 710 and NMOS transistor 720 are coupled to each other. The sources of NMOS transistor 710 and NMOS 720 transistor are also coupled to the drain of a bias NMOS transistor 730. Simplified differential amplifier 700 may represent the j amplifier of an ADC, which may generate an output drain current $I_j$.

For simplicity, cross-coupled outputs are not shown in FIG. 7 (e.g., multiple outputs from simplified differential amplifier 700, and outputs from other differential amplifiers in the ADC, which may be received by simplified differential amplifier 700). The number of cross-coupled outputs may be a function of the transistor geometry, process constants, matching, LSB size and operating current. The number of cross-coupled outputs may be approximated in the following analysis. If $I_j$ is the output drain current of the "j" amplifier in an amplifier according to an embodiment of the present invention, then $$I_j = k\{jVd/2 \pm [I/(2k) \pm (jVd/2)2]^{1/2}\}^2 \quad (5)$$

Assuming that $(Vd/2)^2 \ll I/(2k)$, the drain current variance $[\sigma_j/\sigma]^2$ can be estimated for each amplifier to be approximately:

$$[\sigma_j/\sigma]^2 = [I_j/(2I)]^2 \approx \tfrac{1}{4} - (jVd/2)[k/(8I)]^{1/2} + (jVd/2)^2[k/(2I)] \quad (6)$$

where, $k = \mu p/nCox(W/L)/2$, Vd is the differential input voltage, I is the differential pair tail current, and j is the index of the amplifier within a comparator string. The standard deviation can be approximated as:

$$\sigma \approx A_{aP}/(WL)^{1/2} \quad (7)$$

In equation (7) $A_{aP}$ is Pelgrom's process mismatch constant.

If $Io_{composite}$ is the combined, cross-coupled output current of a single converter code (not shown in FIG. 7, see FIGS. 4A and 4B), the expected mean value of $Io_{composite}$ can be determined by summing the individual cross-coupled output currents from the neighboring amplifiers.

$$Io_{composite} = \Sigma I_j \text{ for } j=1 \text{ to } m, \text{where } m \text{ is the number of outputs} \quad (8)$$

$$Io_{composite} \approx (m3/3)k(Vd/2)^2 \pm 4(m2/2)(Vd/2)(kI)^{1/2} + mI/2 \quad (9)$$

The variance of the mean is:

$$\sigma^2_{mean} = \Sigma(\sigma j, m)^2 = \Sigma[I_j/(2mI)]^2 \text{ for } j=1 \text{ to } m \quad (10)$$

Therefore, the standard deviation of the mean is approximately:

$$\sigma_{mean} \approx [A_{aP}/(WL)^{1/2}]\{1/(2m)^2 \pm (Vd/2)[k/(2I)]^{1/2}/4 + (m/3)(Vd/2)^2[k/(2I)]\}^{1/2} \quad (11)$$

As an example, assuming m=6, I=10 nA, and the above process constants for a 0.18 μm×0.8 μm CMOS process, a sample calculation yields $\sigma_{mean}/I \approx \pm 10\%$ which indicates less than a ⅓ LSB distribution without missing codes.

The number of cross-coupled amplifier outputs may be uniform or non-uniform from one amplifier to another in the comparator string, as the case may be. One skilled in the art will recognize that any number of amplifier outputs may be used to cross-couple with other outputs in the comparator string, with the LSB distribution without error improving as the number of cross-coupled amplifier outputs (m) approaches the total number of amplifiers in the comparator string. The adjacent neighbors may have the most impact on each other, and the impact from the outputs from amplifiers further away in the comparator string becomes more and more attenuated.

The number of cross-coupled amplifier outputs (m) may be determined by a second analytical method used to calculate the number of cross-coupled outputs (m) for each comparator by considering the point of diminishing return for the number of cross-coupled outputs (m) when generating a composite output. This second analytical method may not necessarily assure DNL success, but rather is an estimate for the effective number of cross-coupled outputs before the approximate point of diminishing return is reached for the number (m) of amplifier outputs. If it is assumed that $I_m = I/4$, greater values of m may offer little value due to the small relative current contribution.

Assuming again that $k = \mu p/nCox(W/L)/2$, Vd is the differential input voltage, I=diff pair tail current, and j is the index of the amplifier within a comparator string, the number of cross-coupled outputs, m, is approximately:

$$m = (1+\sqrt{3})(I/k)^{1/2}/(2Vd) \quad (12)$$

For analysis, assume that the process constant values, $k_{NMOS} = 350$ μA/V2, for NMOS 0.18 μm×0.8 μm; and $k_{PMOS} = 150$ μA/V2, for PMOS 0.18 μm×0.8 μm. It is noted that these process constant values may vary for different process technologies and are given as an example for analysis purposes, and not as a limitation to a specific process technology. With the above assumptions for an 0.18 μm×0.8 μm CMOS process, a sample calculation for the situation with a 10 nA tail current and with a 2 mV LSB yields 4 gm amp outputs (m=(1+√3)(10e−9/350e−6)½/(2*2e−3)), and 6 gm amplifier outputs (m=(1+√3)(10e−9/150e−6)½/(2*2e−3)). In other words, in this example the number of cross-coupled outputs (m) for each comparator may be about 4 when using NMOS transistors and about 6 when using PMOS transistors considering the diminishing return for increasing the number of cross-coupled outputs (m). These numbers may change depending on the characteristics of the transistors and the processes used.

FIGS. 8A-8D illustrate examples of comparators with a single input and multiple outputs according to an embodiment of the present invention. Such a comparator may be implemented as part of a Benorion ADC as is described herein. For example, comparator 800 of FIG. 8A includes a first comparator 810 including NMOS transistors 812, 814 configured as a differential amplifier. Comparator 800 further includes a second comparator 820 including PMOS transistors 822, 824 configured as a differential amplifier. A differential amplifier configuration may include two NMOS transistors (e.g., 812, 814) coupled such that the sources are operably coupled. The first comparator 810 and the second comparator 820 are operably coupled such that the gate of each receives an input signal (e.g., $V_{IN}$) and a voltage reference signal (e.g., $V_{REF}$) as inputs for comparing the input signal with the voltage reference signal to generate a differential amplifier output. The first comparator 810 may be operably coupled to a current mirror 830 that may include multiple stages for generating a series of outputs ($I_{P0}$-$I_{P3}$) responsive to the differential amplifier output. Likewise, second comparator 820 may be operably coupled to a current mirror 840 that may include multiple stages for generating a series of outputs ($I_{N0}$-$I_{N3}$) responsive to the differential amplifier output. Additionally, other transistors may be used as shown for power regulation, for holding (i.e., latching) certain signals, or for other reasons.

Figure 8A:
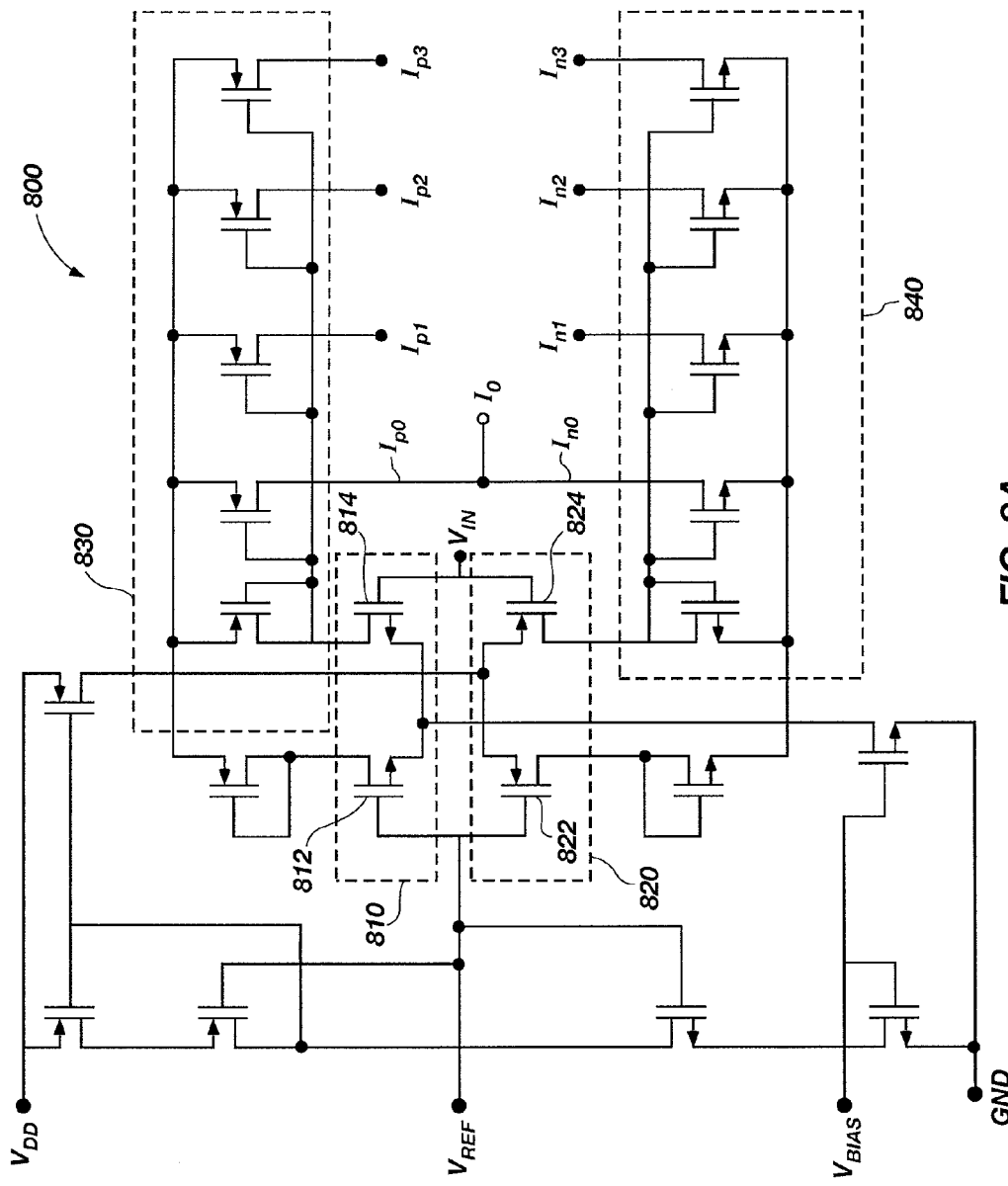

The first set of outputs $I_{P0}$, $I_{N0}$ may combine to generate the primary output $I_o$ from the comparator 800 (see also, e.g., FIG. 6). The additional outputs ($I_{P1}$-$I_{P3}$, $I_{N1}$-$I_{N3}$) may couple with outputs from other individual comparators in a comparator string (e.g., in an ADC) to form composite outputs (see, e.g., FIG. 4A). Additionally, primary output current $I_o$ may combine with other additional outputs from other individual comparators in a comparator string to generate a composite output for the particular code associated with comparator 800. The comparator 800 of FIG. 8A shows three additional outputs ($I_{P1}$-$I_{P3}$, $I_{N1}$-$I_{N3}$); however, more or fewer additional outputs ($I_{P1}$-$I_{P3}$, $I_{N1}$-$I_{N3}$) may exist based on designer preference, the point of diminishing returns, or other relevant factors. To illustrate this point, that the number of additional outputs may vary, FIGS. 8B-8D list additional outputs as and where "M" is an index reference number indicating the number of additional outputs.

As was discussed in FIG. 6, some of the additional outputs may be positive currents (e.g., $I_{P1}$-$I_{P3}$) and some additional outputs may be negative currents (e.g., $I_{N1}$-$I_{N3}$). Positive and negative currents may be defined as such in relation to one another and based on a reference direction for current flow, and not necessarily as a particular direction of flowing electrons. When implemented in an ADC, the additional output currents are operatively coupled with other output currents from other comparators (such as primary output currents, other additional output currents, or any combination thereof). These output currents may be summed (which also may be referred to as averaged) with each other in order to generate a composite output for each output code. For example, a positive current on one side of the composite output code is averaged by negative current on the other side of the composite output code.

It is noted that the relative strength of the current for the additional outputs ($I_{P1}$-$I_{P3}$, $I_{N1}$-$I_{N3}$) of an individual comparator (e.g., comparator 800) may have a substantially equal current strength relative to each other. In addition, the additional outputs ($I_{P1}$-$I_{P3}$, $I_{N1}$-$I_{N3}$) of an individual comparator may be substantially equal in strength as the individual outputs ($I_{P0}$, $I_{N0}$) forming the primary output ($I_0$). For example, output currents ($I_{P0}$-$I_{P3}$) may be substantially equal with each other. Likewise, output currents ($I_{N0}$-$I_{N3}$) may be substantially equal with each other. However, as a reminder, it is noted that when implemented in an ADC with a plurality of individual comparators, the relative strength from adjacent comparator outputs may be a function of the analog input voltage and the position of the code related to the voltage reference signals. In other words, the additional outputs from closely neighboring comparators in the comparator string may have a stronger influence over a composite output than the additional outputs from more distant comparators in the comparator string (refer to the discussion regarding the point of diminishing returns).

Figure 8B:
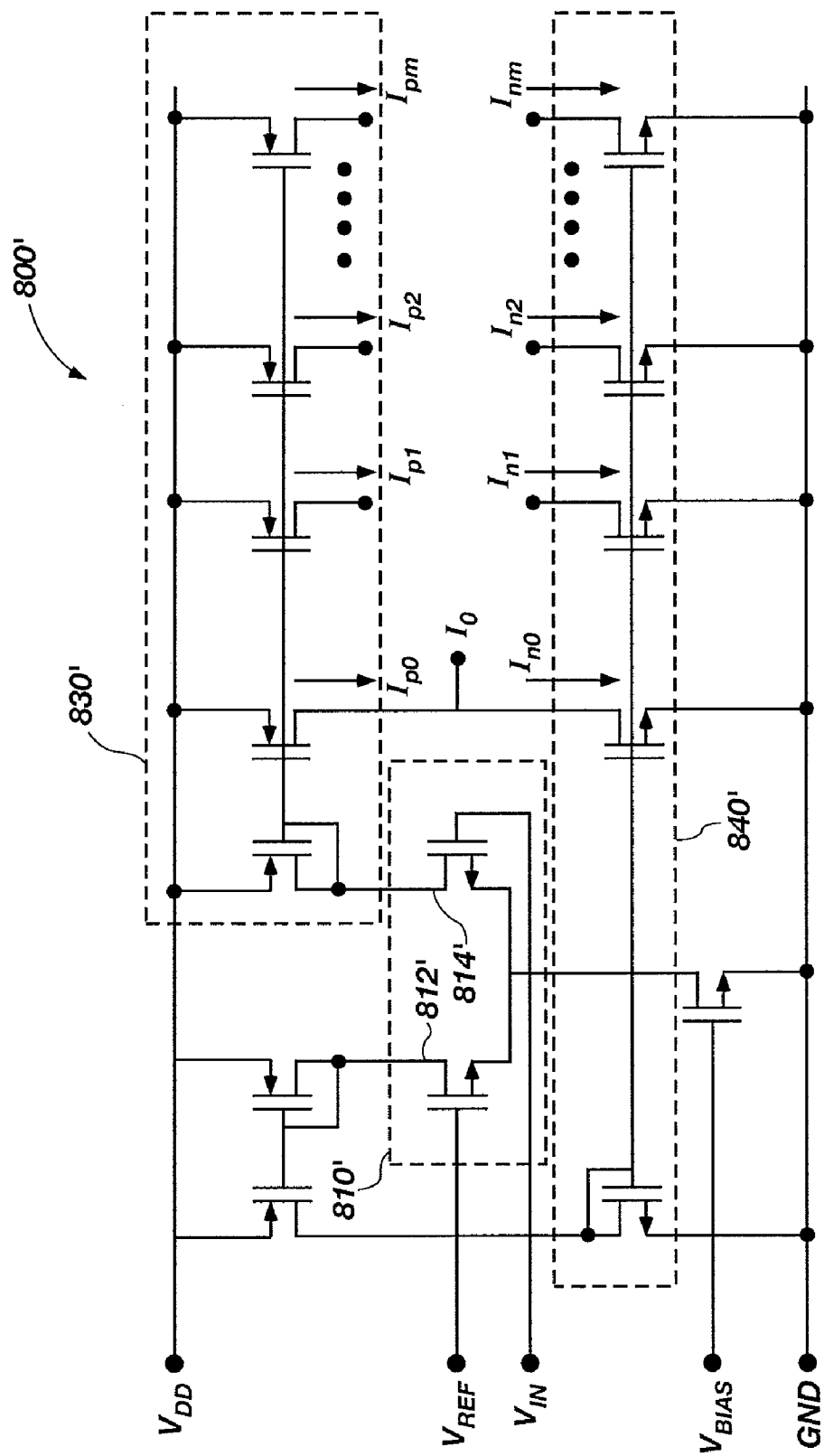
Figure 8D:
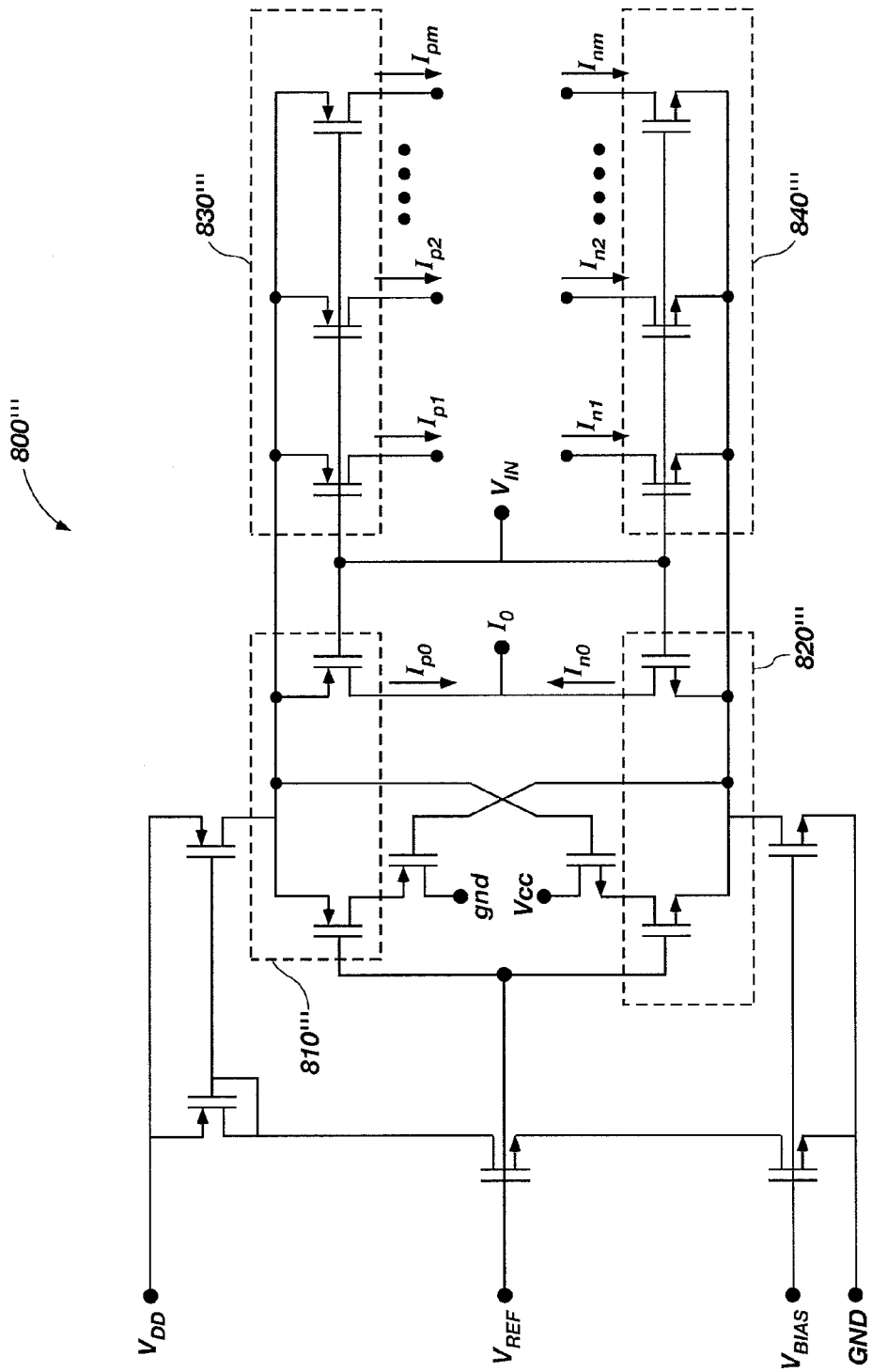

Although various specific configurations for comparators are shown herein, many different configurations are possible for a single input, multiple output comparator. Examples of such configurations are shown in FIGS. 8B-8D as comparators 800', 800", and 800'''. Similar elements in FIGS. 8B-8D related to those in FIG. 8A are indicated with like numbers and a corresponding prime number notation (e.g., 810', 810", and 810''' for first comparators with transistors configured as differential amplifiers) according to the respective figure. As shown in these additional exemplary configurations, there may be a different number of comparators configured as differential amplifiers. For example, FIG. 8B shows one configuration of a comparator 800' with only a first comparator 810'. Additionally, more than one bias voltage may exist (e.g., FIG. 8C show bias voltage signals $V_{BIAS1}$, $V_{BIAS2}$ coupled with first and second comparators 810", 820").

Even more configurations for comparators may also be possible than those shown in FIGS. 8A-8D. These additional configurations may range from simple to complex in terms of the number of components used. Each configuration may have its own unique characteristics making it useful to particular application requirements (e.g., differences in timing symmetry). If implemented in an ADC, the multiple output currents are operatively coupled and summed with each other in order to generate a composite output for each output code. Positive current on one side of the composite output code is averaged by negative current on the other side of the composite output code.

Embodiments of the invention illustrated herein have shown comparators and ADCs using CMOS processes because of the unique advantages that using CMOS transistors have over conventional ADCs. However, embodiments of the present invention may also include other transistors and processes, such as BJT and gallium-arsenide processes. Embodiments including BJT or gallium-arsenide processes may be desirable for relatively small LSBs such that the composite output codes would be close together.

Once the analog input signal $V_{IN}$ is processed through a first stage of a comparator string of comparators with cross-coupled outputs to generate a quasi-digital current output, the voltage gain might generally be approximated as:

$$Av=gm_{1,2}(r_p\|r_n)=\sqrt{(2/I)}\sqrt{k}/(\lambda_n+\lambda_p) \quad (13).$$

In equation (13), k is about ½μCoxW/L and λ is the CMOS channel length modulation factor. Additional voltage gain may be necessary to achieve sufficient digital characteristics. Therefore, at least one additional stage may be required. The at least one additional stage may also require further cross-coupled outputs to compensate for mismatch in the second stage amplifiers. The following figures illustrate examples of additional stages, which may be used in embodiments of the present invention.

Figure 9A:
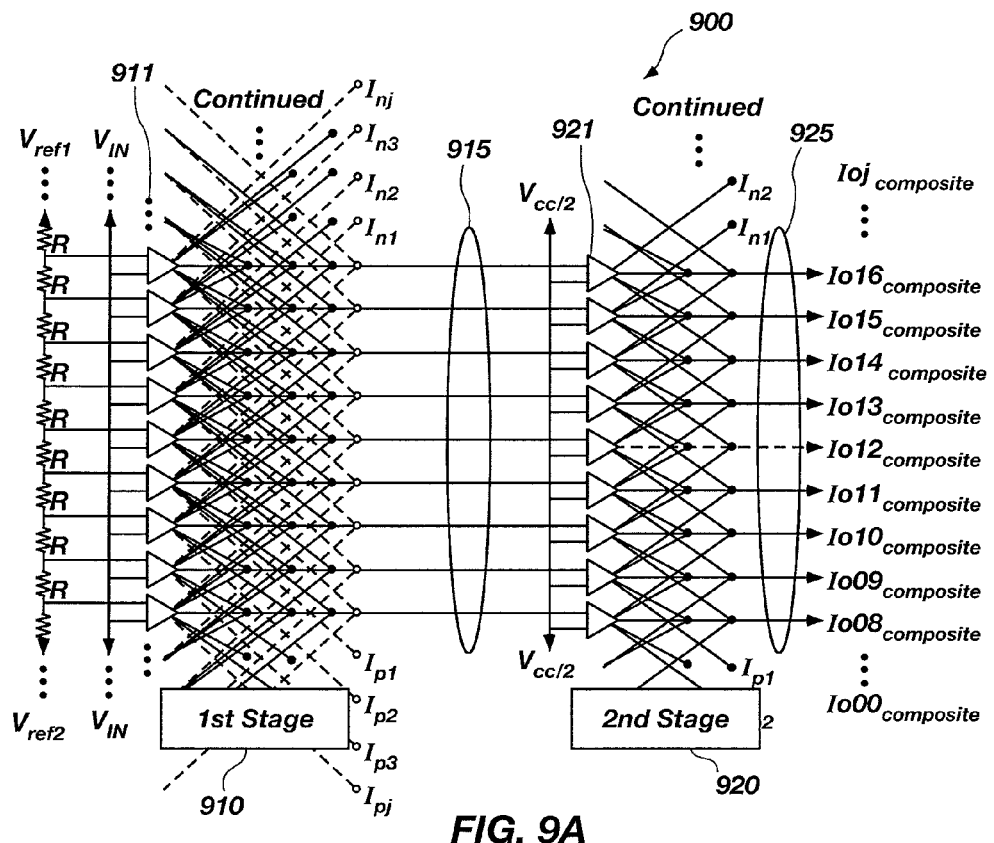
FIGS. 9A and 9B illustrate an analog-to-digital converter with a plurality of stages, and the outputs of the plurality of stages according to an embodiment of the present invention.
Figure 9B:
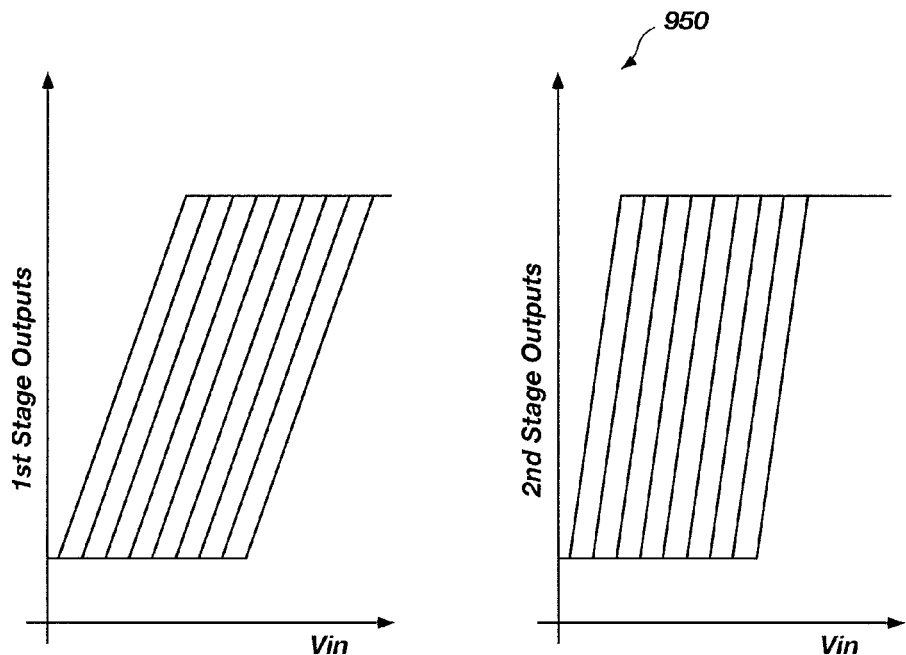

FIGS. 9A and 9B illustrate an analog-to-digital converter 900 with a plurality of stages, and outputs 950 of the plurality of stages according to an embodiment of the present invention. As previously stated, additional voltage gain may be necessary to achieve sufficient digital characteristics. Additional stages may also be implemented for other reasons, such as, for example if there is enough mismatch within the transistors such that there is still an undesirable lack of monotonistic behavior of the bits in the output line coming out of a first stage 910. A second stage 920 may be operably coupled to the output of the first stage 910.

In FIG. 9A the first stage 910 includes a comparator string 911 including a plurality of single input, multiple-output comparators. The outputs of the comparators of the comparator string 911 are cross-coupled with adjacent comparator outputs to generate a first set of composite outputs 915. The first set of composite outputs 915 may then be input into a second comparator string 921 of the second stage 920. The second stage 920 may also include a second comparator string 921 including a second plurality of single input, multiple-output comparators. The second comparator string 921 may be configured to compare the first set of composite outputs 915 sand a voltage reference (e.g., Vcc/2 as one possible voltage reference value). In the second stage 920, the voltage reference (e.g., Vcc/2) may be a constant voltage rather than a series of voltages that vary from one individual comparator to the next. In FIG. 9, the second stage 920 is configured for generating a second set of composite outputs 925 comprising outputs of individual comparators of the second comparator string 921 coupled with at least one other output of another individual comparator of the second comparator string 921. The second stage 920 may compensate for mismatch that still exists in the first stage 910 and/or add gain to the outputs.

FIG. 9B is a graph illustrating first stage outputs and second stage outputs of the ADC illustrated in FIG. 9A according to an embodiment of the present invention. As previously mentioned, adding an additional stage may add gain to the outputs causing the transitions to be more vertical as illustrated in FIG. 9B when comparing the slope of the transitions of the second stage outputs relative to the first stage outputs. Adding additional stages may also increase averaging and, as a result, may further reduce misplaced codes.

Figure 10:
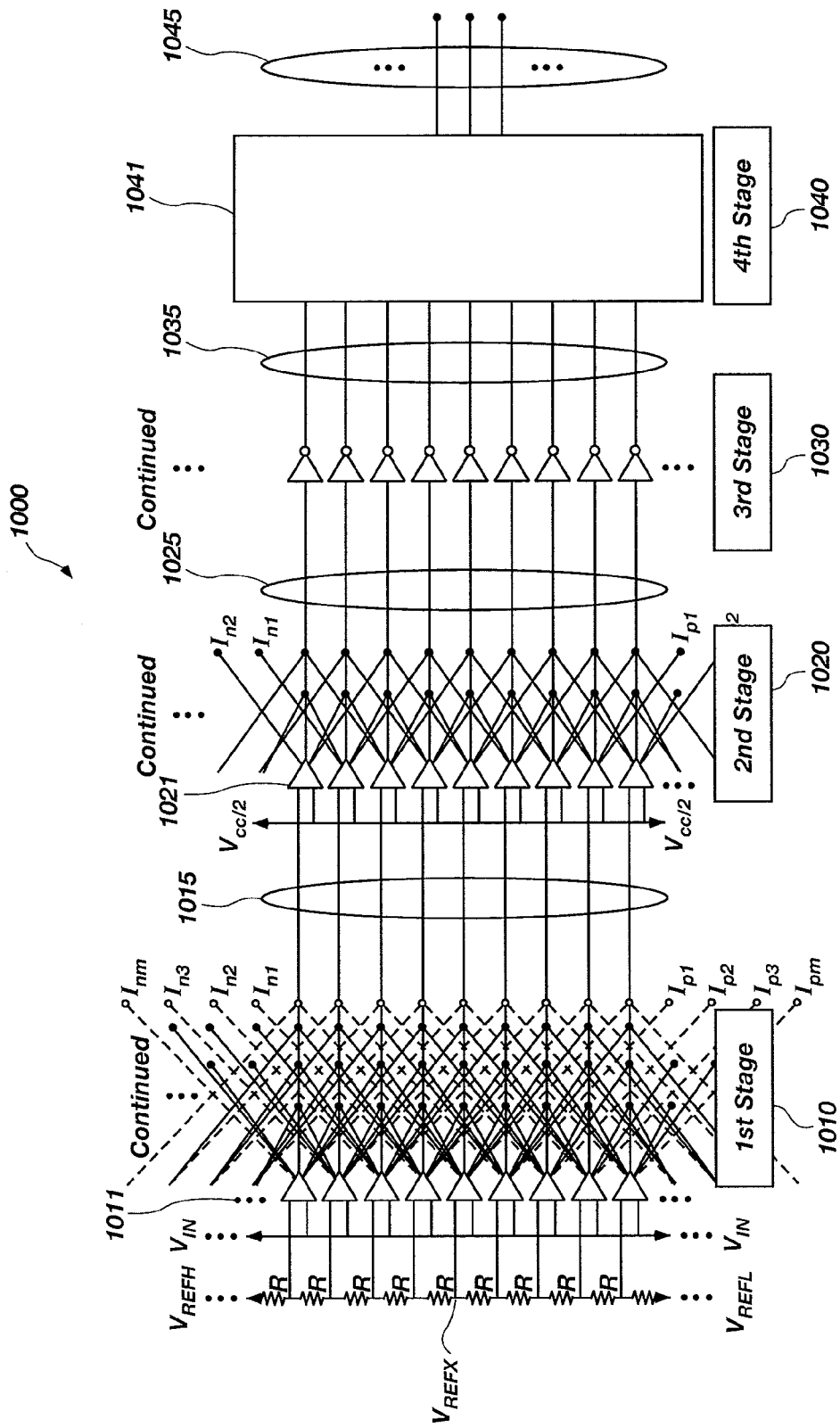
FIG. 10 illustrates an analog-to-digital converter with a plurality of stages.

FIG. 10 illustrates an analog-to-digital converter 1000 with a plurality of stages. Analog-to-digital converter 1000 includes a first stage 1010, second stage 1020, third stage 1030 and a fourth stage 1040. The first stage 1010 is operably coupled with the second stage 1020 such that the outputs from the first stage 1010 are inputs to the second stage 1020. The second stage 1020 and the third stage 1030 are operably coupled such that the outputs from the second stage 1020 are inputs to the third stage 1030. The third stage 1030 and fourth stage 1040 are operably coupled such that the outputs from the third stage 1030 are inputs to the fourth stage 1040.

The first stage 1010 includes a comparator string 1011 including a plurality of comparators. The plurality of comparators are operably coupled for receiving an analog input signal ($V_{IN}$) and configured for comparing $V_{IN}$ with a plurality of voltage reference signals ($V_{REFX}$). As used before, "x" is an index referring to a specific voltage reference signal for an individual comparator in the comparator string 1011. The first stage 1010 further includes a plurality of composite outputs 1015 comprising outputs of individual comparators of the plurality of comparators that are coupled with at least one other output of another individual comparator of the comparator string 1011.

The second stage 1020 includes a second comparator string 1021 including a second plurality of comparators operably coupled for receiving the composite outputs 1011. The individual comparators of the second comparator string 1021 may be configured to compare the composite outputs 1011 and a voltage reference (e.g., Vcc/2 as one possible voltage reference value). In the second stage 1020, the voltage reference (e.g., Vcc/2) may be a constant voltage rather than a series of voltages that vary from one individual comparator to the next. In FIG. 10, the second stage 1020 is configured for generating a second set of composite outputs 1025 comprising outputs of individual comparators of the second comparator string 1021 coupled with at least one other output of another individual comparator of the second comparator string 1021. The second stage 1020 may compensate for mismatch that still exists in the first stage 1010, and/or add gain to the outputs.

The third stage 1030 is shown to be a plurality of digital buffer inverters 1031, which may individually be configured in a manner known in the art. Of course, in some embodiments, the buffers may be configured as non-inverting buffers. The fourth stage 1040 is shown to include a decoder 1041 configured to convert a signal (e.g., third stage outputs 1035) into a digital output signal 1045 (e.g., binary code). Although the different stages are shown in FIG. 10 to include specific configurations, the multiple stages may include different combinations of stages. For example, the second stage 1020 may include a plurality of digital buffer inverters 1031. Further, some stages may be even further duplicated and/or eliminated.

FIGS. 11-15 illustrate simulation results for analog-to-digital converters according to various embodiments of the present invention. Each of these simulations included a Benorion ADC with various stages using a sub-micron CMOS process with 0.18 μm×0.8 μm minimum geometry transistors. Although the following examples are simulated on a 180 nm CMOS process, other processes (e.g., 65 nm, etc.) may be used for embodiments of the invention as well.

Figure 11:
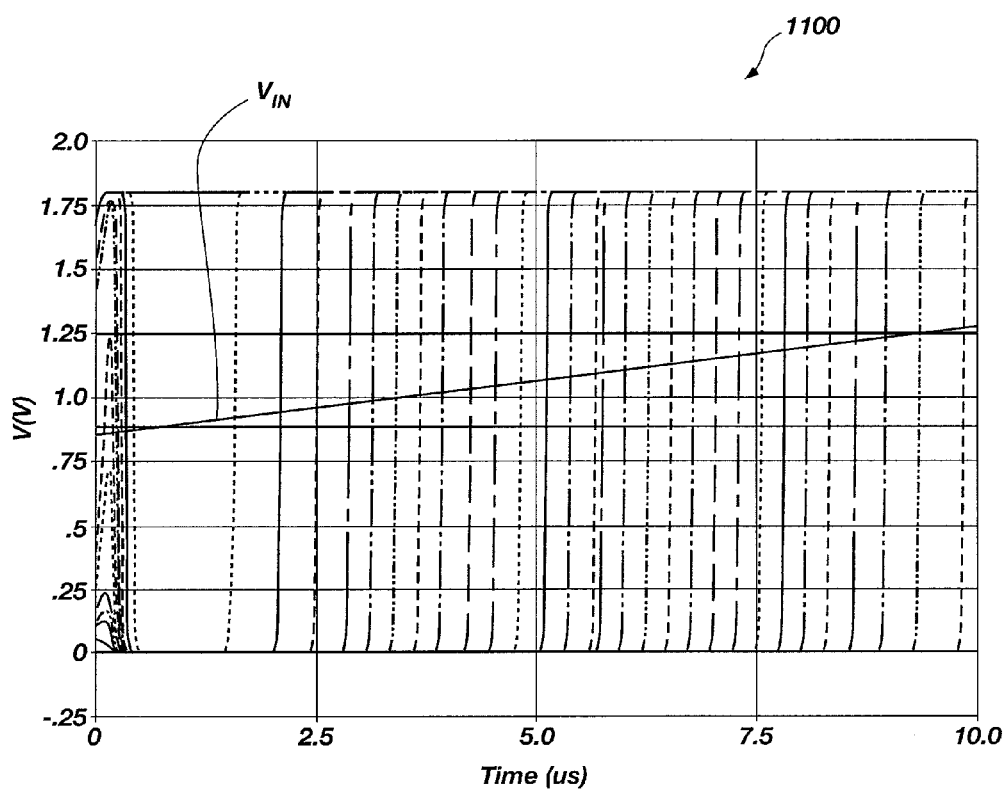
FIG. 11 shows a graph representing simulated results from a 5-bit analog-to-digital converter with three stages according to an embodiment of the present invention.

FIG. 11 shows a graph 1100 representing simulated results from a 5-bit analog-to-digital converter with three stages according to an embodiment of the present invention. A resolution of five bits is illustrated as an example, as the resolution may be higher or lower, as the case may be. The output shown in FIG. 11 is the simulated result after a third stage of a three-stage ADC converter. Adding two additional stages may add voltage gain to the output signal, which may result in a steeper slope for the transitions shown in graph 1100.

Figure 12:
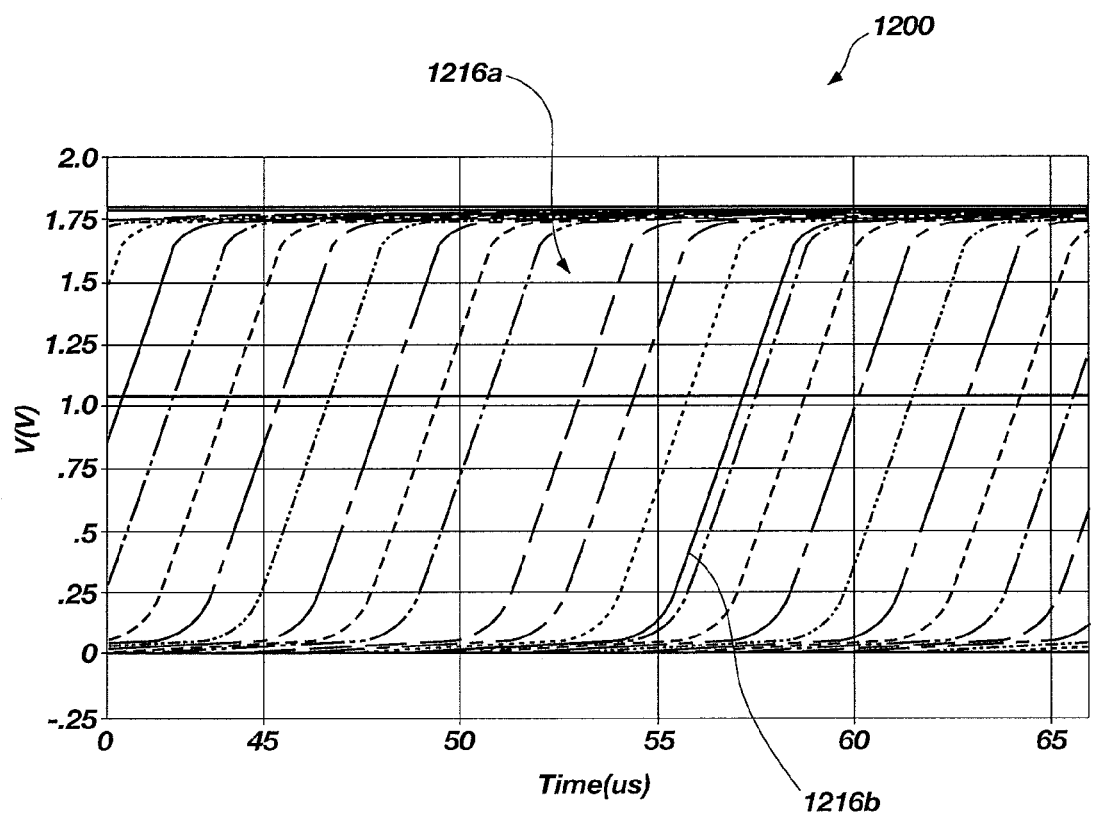
FIG. 12 shows a graph illustrating the simulated output of the first stage of a 6-bit ADC with a forced comparator mismatch according to an embodiment of the present invention.
Figure 13:
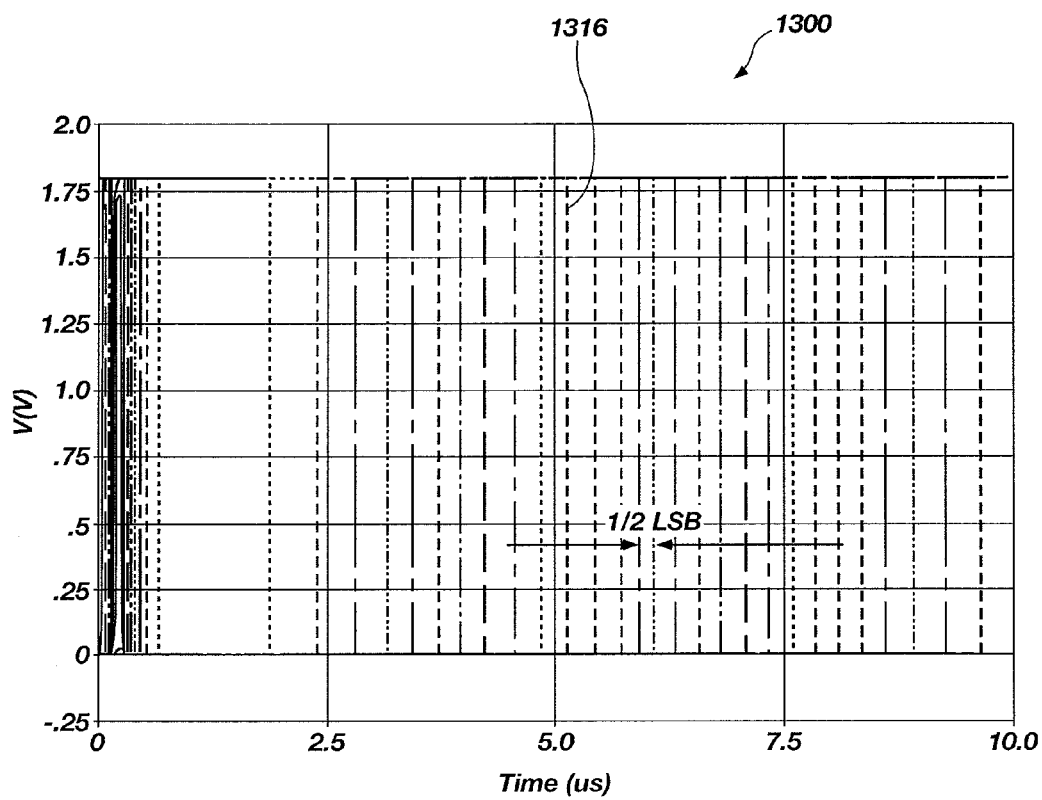
FIG. 13 shows a graph illustrating the simulated output at the fourth stage of a four-stage ADC according to an embodiment of the present invention.

In FIG. 11, two horizontal lines are shown at about 1.26 V and 0.9 V. These horizontal lines represent the high and low voltage reference signals $V_{REFH}$ and $V_{REFL}$, respectively. As previously stated, intermediate voltage references are input to the comparator string. Intermediate voltage references may be generated by a resistor string, or by other resistor or circuit configurations. In this example, a resistor string divided the voltage range between $V_{REFH}$ and $V_{REFL}$ into 32 ($2^5$ for a five bit resolution) different intermediate voltage references (i.e., LSBs, not shown in FIG. 11) for comparison to the analog input voltage signal $V_{IN}$. For the simulation shown in FIG. 11 (and each of the following simulations shown in FIGS. 12 and 13) analog input voltage signal $V_{IN}$ was used in this simulation as a transient analysis voltage sweep. A voltage sweep increases an input signal a certain number of volts for a period of time (e.g., microseconds), which is the reason that the dimension of the x-axis for each of FIGS. 11-13 is in microseconds. As a result, analog input voltage signal $V_{IN}$ is shown in the plot as a diagonal line increasing from about 0.8 V to about 1.3 V.

What is not shown in FIG. 11 is that there is a horizontal voltage threshold for the voltage level of each LSB (i.e., difference between adjacent voltage reference signals between $V_{REFH}$ and $V_{REFL}$) in the comparator string. As $V_{IN}$ increases to a voltage level above a voltage threshold for a particular LSB, the corresponding outputs for each affected comparator transitions from low to high. In other words, in a voltage sweep analysis, as the analog input voltage signal $V_{IN}$ passes through each ladder threshold, the expected output should switch in a sequential, thermometer-type output ordered from a digital low output signal to a digital high output signal. In FIG. 11 each of the substantially vertical lines that start at 0 V and transition to 1.8 V are the individual output codes from each individual comparator of the comparator string of the ADC converter. These outputs can then be decoded into binary if desired, and/or processed as desired by a particular application.

FIG. 12 shows a graph 1200 illustrating the simulated output of the first stage of a 6-bit ADC with a forced comparator mismatch according to an embodiment of the present invention. In this particular simulation, the input comparator for code 16 was forced to have a relatively large mismatch of 3:1 to show the effect of mismatch on DNL. This forced comparator mismatch is shown by code 16 indicated by line 1216b being shifted to the right from location 1216a where code 16 would be located without the forced mismatch. In each of these graphs, DNL can be viewed by the horizontal spacing between the output codes on the graphs. It is noted that DNL remains less than 1 LSB and there are no missing codes. Another item to note in FIG. 12 is that this simulation represents the output of the first stage. As the output signals are of the first stage, the transitions may appear less vertical than some of the graphs of some of the other simulations, which include output of an ADC with multiple stages.

FIG. 13 shows a graph 1300 illustrating the simulated output at the fourth stage of a four-stage ADC according to an embodiment of the present invention. A fourth stage may include a component (e.g., decoder) that converts the code into a digital signal for further analysis or processing. In this particular simulation, the input comparator for code 16 (represented by line 1316) was forced to have a relatively large 300 mV voltage offset in order to show the effect of differential non-linearity with such a voltage offset. As shown in FIG. 13, the DNL remains less than 1 LSB without any missing codes.

Figure 14:
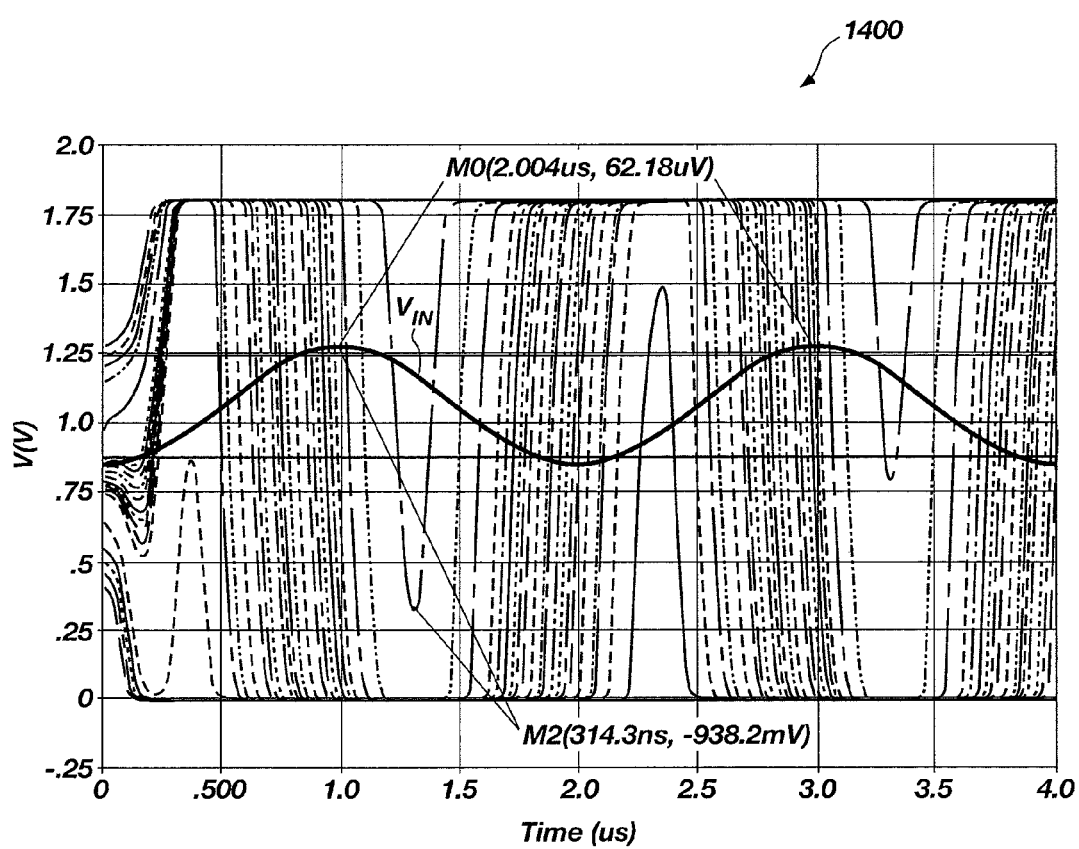
FIG. 14 shows a graph illustrating the simulated output transitions when a 5-bit, three-stage converter is stimulated with a 500 kHz input voltage according to an embodiment of the present invention.

FIG. 14 shows a graph 1400 illustrating the simulated output transitions when a 5-bit, three-stage converter is stimulated with a 500 kHz input voltage ($V_{IN}$) according to an embodiment of the present invention. As $V_{IN}$ moves through the different thresholds created by voltage reference signals, the outputs of the comparators transition from low to high. As shown in FIG. 14, there is some delay (i.e., lag) from when the $V_{IN}$ passes through a threshold and when the corresponding output is generated. As shown in FIG. 14, there are about 56 degrees of phase shift at 500 kHz and 5 mW of power dissipation.

Figure 15:
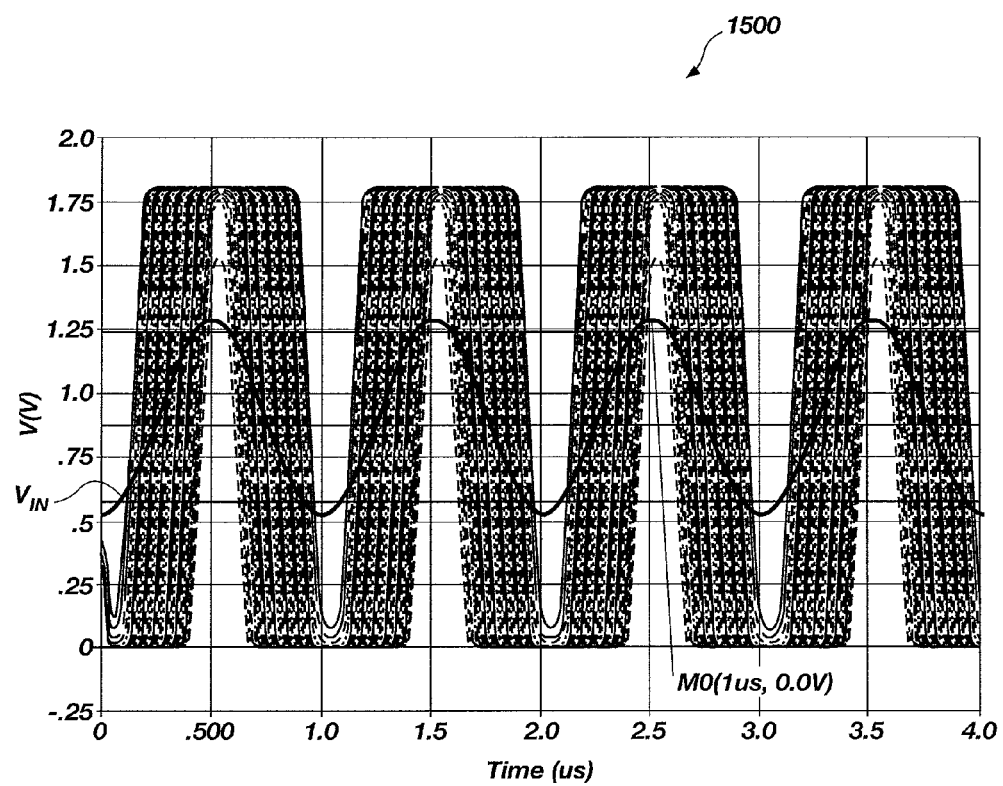
FIG. 15 shows a graph illustrating the simulated output transitions when a 6-bit ADC converter at is simulated with a 1 MHz input voltage consuming 54 uW according to an embodiment of the present invention.

FIG. 15 shows a graph 1500 illustrating the simulated output transitions when a 6-bit ADC is simulated with a 1 MHz input voltage ($V_{IN}$) consuming 54 uW according to an embodiment of the present invention. In FIG. 15, there is shown about 10 degrees of phase shift. Thus, the ADC converter is stable in FIGS. 14 and 15 if implemented in a control loop with such parameters.

It is further noted that the end stage of a Benorion ADC may include unaveraged ends as has been described herein. Additionally, it is noted that it may be desirable to extend the number of individual comparators beyond that which is conventionally required for a given resolution. In other words, an 8-bit converter may have more than 256 comparators so that the ends will have other comparator outputs to average with. Several other termination methods are also possible which are appreciated by the inventor and which will be appreciated by those of ordinary skill in the art after reading the present disclosure, each termination method with its own set of advantages and disadvantages. The termination methods described herein are to be seen as examples only, and not as a limitation herein.

Figure 16:
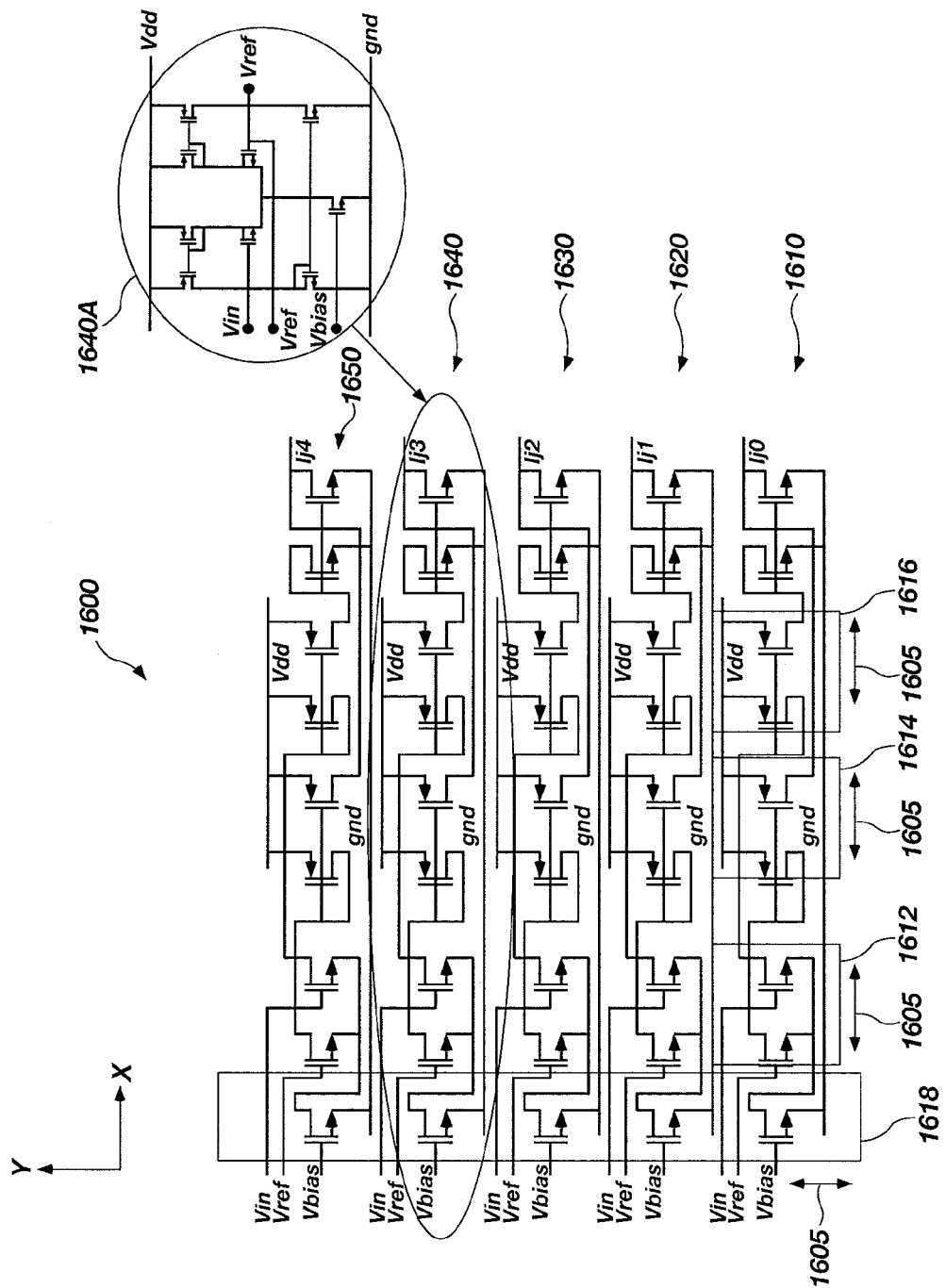
FIG. 16 is a schematic representation of a physical layout of an ADC according to an embodiment of the present invention.

FIG. 16 is a schematic representation of a physical layout 1600 of an ADC according to an embodiment of the present invention. It is noted that the X and Y directions are defined as shown in FIG. 16, but that X and Y directions are merely labels for a first direction and a second direction orthogonal to the first direction. The physical layout 1600 includes transistors of an individual comparator (e.g., 1610) arranged in rows in the X direction, which comparator may be repeated (i.e., stacked) in the Y direction to form a two dimensional array of comparators (e.g., 1610, 1620, 1630, 1640, 1650). In other words, individual comparators may include transistors that are one-dimensionally arranged in rows of a two-dimensional array such that neighboring comparators are positioned relative each other in an abutting configuration.

For example, individual comparators 1610, 1620, 1630, 1640, 1650 each have a physical layout that is arranged in a row in the first direction defined in FIG. 16 as the X direction. Schematically, comparator 1640A may be symbolically represented as having transistors in both the X and Y directions. As discussed, conventional physical layouts are based on such two-dimensional schematic representations of an individual component. However, the same comparator 1640 may be represented as a one-dimensional schematic representation with transistors arranged in rows in the X direction, and from which the physical layout may be determined. When combined with other individual comparators 1610, 1620, 1630, 1650, such as to form a comparator string for an ADC, the transistors may aligned in the Y direction to form columns of transistors in the Y direction. An example of such a column in the Y direction is shown by box 1618. In other words, a two-dimensional array of transistors is formed, wherein each row of the array is configured to perform a comparator function of an input signal Vin and a reference signal Vref. Thus, the transistors are arranged in rows in a first direction (X direction) within individual comparators 1610, 1620, 1630, 1640, 1650, and transistors may be arranged in columns in a second direction (Y direction) from comparator to comparator. The transistors in the same column in the Y direction may perform similar functions for the respective rows of comparators. For example, the transistors within box 1618 may be each be bias transistors for the respective comparators 1610, 1620, 1630, 1640, 1650. The transistors in the same column as differential amplifier 1612 may also be configured as differential amplifiers for their respective comparators 1610, 1620, 1630, 1640, 1650. The same may be true for the transistors above current mirrors 1614 and 1616 located in the same column in the Y direction.

Figure 3A:
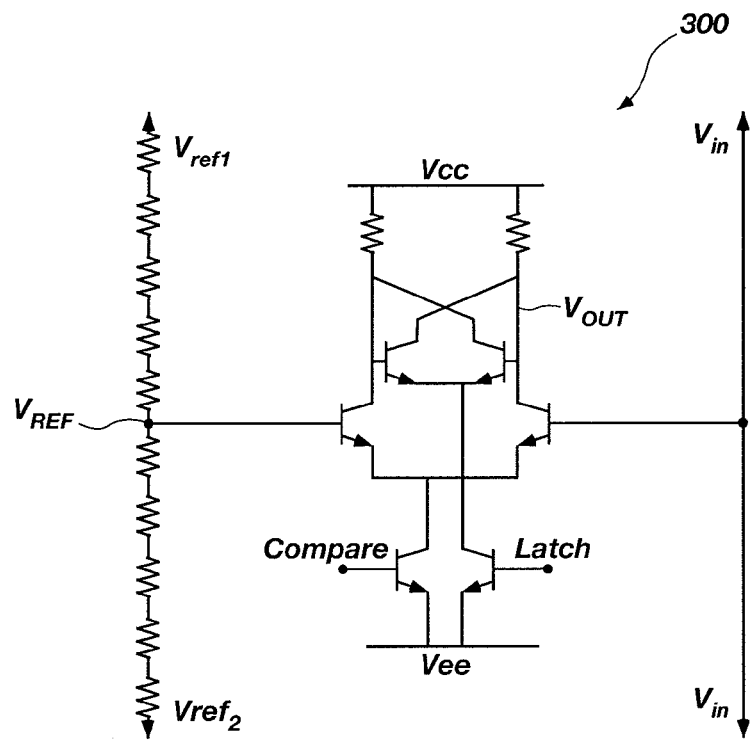
FIGS. 3A-3C illustrate configurations of comparators, such as those used in a comparator string of a conventional flash analog-to-digital converter, using BJT or CMOS processes.
Figure 3B:
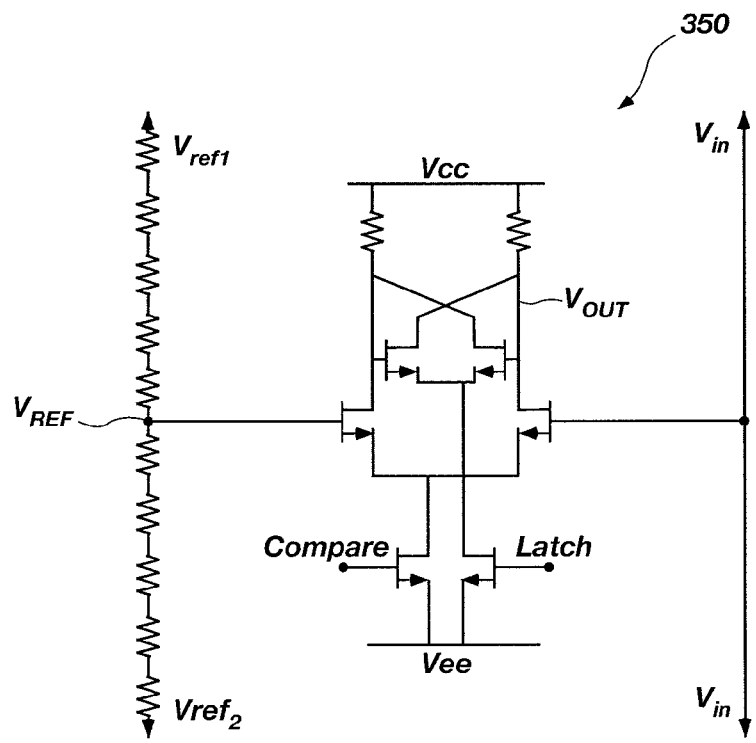
Figure 3C:
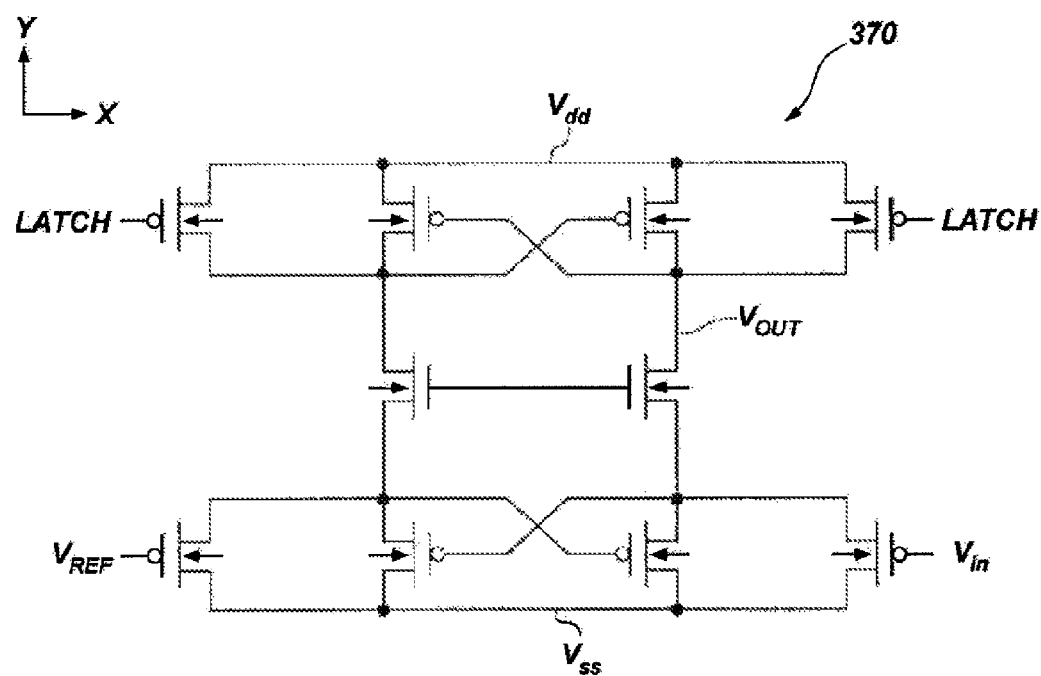

It should be noted that the term "alignment" is not intended to refer to orientation, but is rather intended to refer to the transistors arranged in a one-dimensional row or column. Additionally, a one-dimensional row or column is intended to allow for minor offsets, which may result from errors in fabrication, for making interconnections, or for other reasons related to layout constraints of the one-dimensional row. Thus, a one-dimensional row or column does not require perfect alignment along all transistors in the row or column. The term "one-dimensional" refers to transistors that are arranged in a substantially single direction. This definition is contrasted with the conventional layouts discussed above for FIGS. 3A-3C in which a single comparator included transistors arranged in two distinct directions, which single comparators may also be arranged in different directions.

The arrangement of transistors in one-dimensional rows in the X direction may improve matching 1605 between the transistors of the differential amplifier 1612 as well as between the transistors of the current mirrors 1614 and 1616. "Matching" of transistors may also refer to position (i.e., physical closeness between transistors) and orientation (i.e., orientation of drain, source, gate in relation to other transistors). Improving such matching may further reduce misplaced or missing codes caused by DNL errors.

It is noted that the physical layout 1600 shows a flash ADC in that the comparators 1610, 1620, 1630, 1640, 1650 have single outputs (1044). Thus, outputs (1044) are independent of each other. This schematic representation of the physical layout 1600 is shown for simplicity as the additional outputs and interconnections of a Benorion ADC as described herein may obscure the figure. However, even flash ADCs and other devices with a physical layout 1600 according to an embodiment of the present invention may experience improved matching from transistors in the X direction. Additionally, flash ADCs and other devices may also experience a decrease in the physical footprint (i.e., reduced die size) of the device as there may not be as much wasted space between components. For example, if all things are equal (i.e., same number of transistors, same process, same number of metal layers, etc.) a device with a physical layout according to an embodiment of the present invention may have a reduced physical footprint in comparison to a device configured in accordance with a conventional layout.

In a Benorion ADC, other advantages may exist in addition to a possible reduced footprint. For example, the improved matching 1605 in the Y direction may improve performance related to the contribution of the comparators (e.g., 1650, 1630, 1620, 1610) above and below a given comparator (e.g., 1640). For example, box 1618 illustrates an alignment of the bias transistors in the Y direction, which may improve matching 1605 in the Y direction of the tail currents for each comparator 1610-1650.

As previously described, when DNL errors due to device mismatch appear randomly in a comparator, missing and misplaced codes may occur. In conventional flash ADCs, the comparator outputs may couple with a digital encoder, which may attempt to fix errors. As a result, the processing time in converting the analog signal input to a digital signal may be increased. In contrast, a Benorion ADC may improve performance against such errors as they occur by weighing the collective output response of a plurality of individual comparators. In other words, one or more comparators may be inter-coupled, such that a primary comparator output of one comparator is coupled with at least one additional comparator output from a neighboring comparator to form a composite output. Of course, one skilled in the art will appreciate that post processing error correction may be employed in a Benorion ADC if the additional latency is acceptable. In other words, a Benorion ADC, which experiences further error correction from a digital encoder, is contemplated as being within the scope of embodiments of the present invention.

Figure 17A:
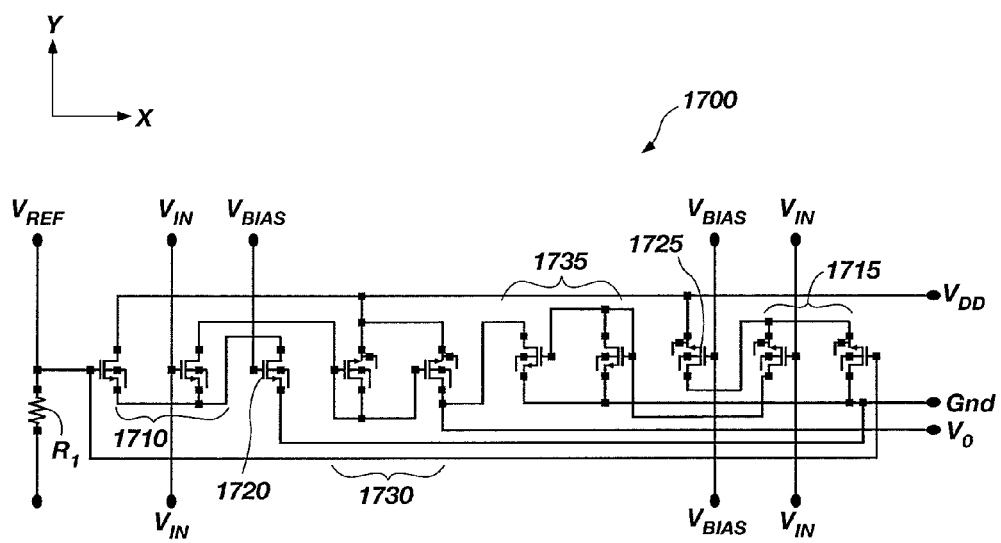
FIG. 17A is a schematic representation of a physical layout for a comparator with transistors configured according to an embodiment of the present invention.

FIG. 17A is a schematic representation of a physical layout for a comparator 1700 with transistors configured according to an embodiment of the present invention. Comparator 1700 includes NMOS differential amplifier pair 1710, NMOS bias transistor 1720, NMOS current mirror 1730, PMOS differential amplifier pair 1715, PMOS bias transistor 1725, and PMOS current mirror 1735. While NMOS transistors 1710, 1720, 1730 are shown on the left and PMOS transistors 1715, 1725, 1735 are shown on the right of comparator 1700, such an arrangement is not intended as a limitation, and other configurations and arrangements are be contemplated as being within the scope of embodiments of the present invention.

As previously described, comparator 1700, may be arranged in one-dimensional rows in the X direction, which arrangement may improve matching between transistors in the X direction. Such an arrangement in rows in the X direction may also reduce the physical footprint of the comparator 1700 when at least one additional comparator is repeated in the Y direction during fabrication, as is shown in FIG. 17B.

Figure 17B:
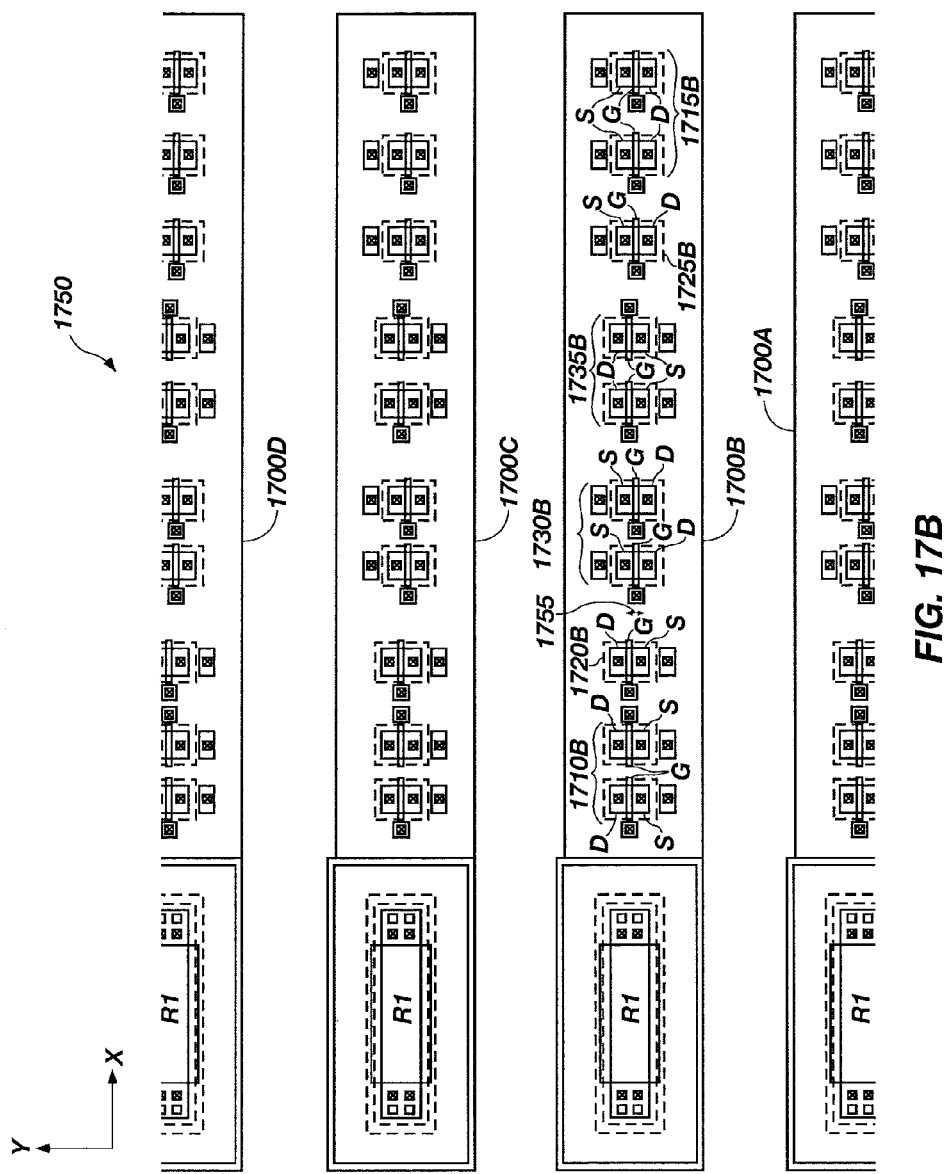
FIG. 17B is a physical layout representation of an ADC according to an embodiment of the present invention.

FIG. 17B is a physical layout representation 1750 of an ADC according to an embodiment of the present invention. The ADC includes a resistor string represented by resistors R1 coupled to a string of comparators 1700A-1700D. Details regarding some of the physical layout 1750 of the ADC, including interconnections, have been simplified so as not to obscure the figure with unnecessary detail. The transistor layout and interconnections for each of comparators 1700A-1700D may be substantially similar in configuration to the symbolic representation of comparator 1700 in FIG. 17A. Thus, transistors within each of the plurality of comparators 1700A-1700D may be arranged in one-dimensional rows in the X direction. The plurality of comparators 1700A-1700D is also repeated in the Y direction. Consequently, the regions of wasted space between individual comparators 1700A-1700D may be reduced. For example, the distance between adjacent comparators may primarily be constrained by the requisite metal layers therebetween. For higher level metal processes (e.g., 5 or 6 level metal process used in a device such as a processor), the physical separation of each comparator in the Y direction may be further reduced as more metal layers are raised up to different levels.

Additionally, alignment may exist for transistors in the Y direction from comparator to comparator. For embodiments that include coupling between individual comparators 1700A-1700D (e.g., Benorion ADC), such alignment of transistors in the Y direction may further improve matching between comparators. Improved matching between comparators may further improve performance and reduce DNL errors.

FIG. 17B further shows that one-dimensional rows are not required to include perfect alignment of transistors. For example, FIG. 17B shows some offset in the Y direction between the some of the NMOS transistors 1710B, 1720B, 1730B and the PMOS transistors 1715B, 1725B, 1735B. For example, offset 1755 is shown between the gates (G) of the NMOS bias transistor 1720B and the NMOS current mirror 1730B.

Additionally, FIG. 17B shows that the orientation of some of the NMOS transistors 1710B, 1720B, 1730B and the PMOS transistors 1715B, 1725B, 1735B are the same. For example, the transistors of the NMOS differential pair 1710B have the same orientation. That is, the drain (D), gate (G), and source (S) are each oriented in the same manner. Likewise, transistors of the current mirrors (e.g., 1735B) may have the same orientation. The orientation and the physical closeness may affect the matching between transistors. Physical closeness of the transistors may be reduced by reducing the separation of the transistors in the X direction and reducing the offset of the transistors in the Y direction. Additionally, while not shown in FIG. 17B, the orientation of all transistors of a comparator row (e.g., 1700B) may be the same.

Figure 18A:
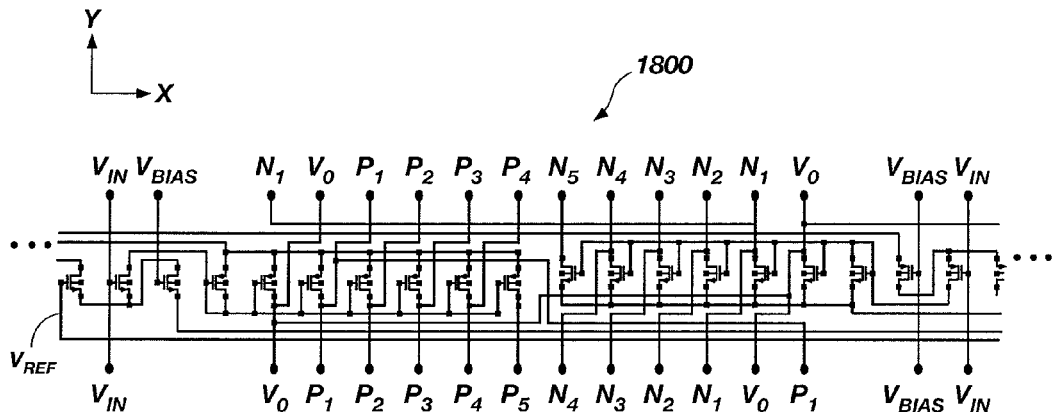
FIG. 18A is a schematic representation of a physical layout of a comparator according to an embodiment of the present invention.

FIG. 18A is a schematic representation of a physical layout of a comparator 1800 according to an embodiment of the present invention. The comparator 1800 includes transistors one-dimensionally arranged in a row in a first direction (e.g., X direction). The comparator 1800 has single input ($V_{IN}$) to compare against a reference voltage ($V_{REF}$) and a plurality of output lines ($V_0$, $N_1$-$N_5$, $P_1$-$P_5$), which may be configured as previously described herein. In particular the comparator 1800 may be configured to generate currents on the plurality of output lines ($V_0$, $N_1$-$N_5$, $P_1$-$P_5$), wherein a current direction of at least one individual output line (e.g., $N_1$-$N_5$) of the plurality is different than a direction of at least one other individual output line ($P_1$-$P_5$) of the plurality. The comparator 1800 may be employed in a Benorion ADC configured to weigh collective outputs of a plurality of such comparators to form composite outputs as previously described herein.

Figure 18B:
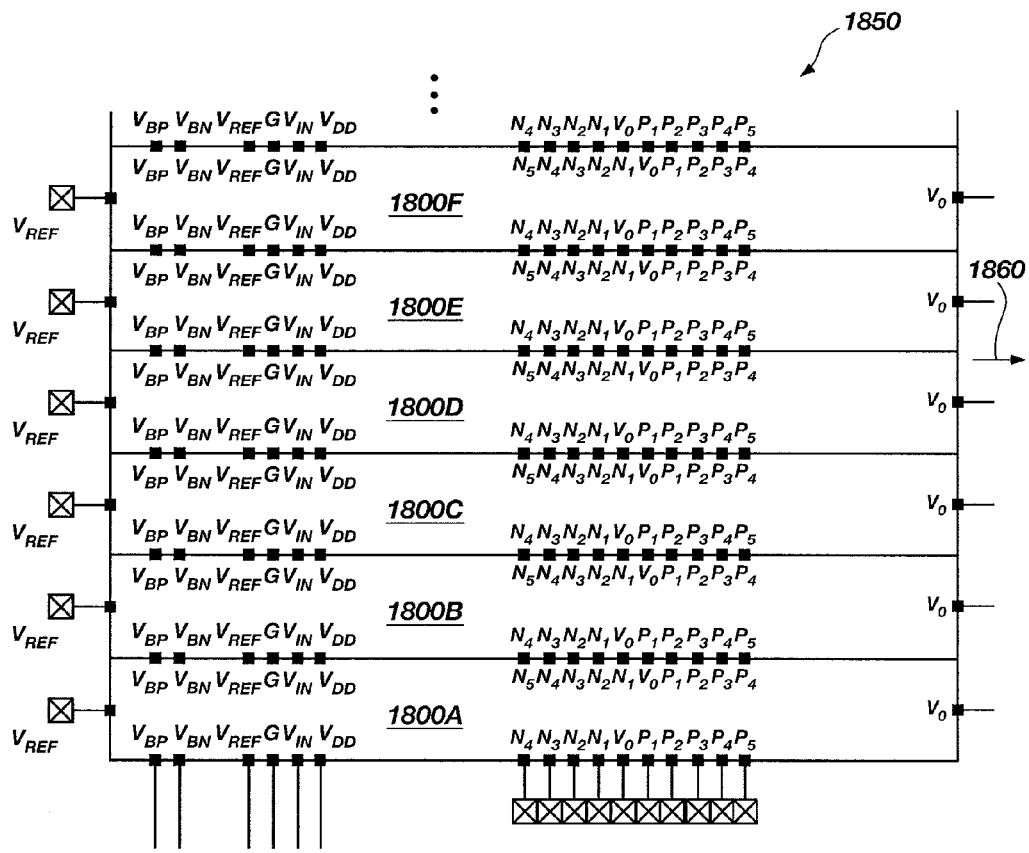
FIG. 18B is a schematic representation of a physical layout of an ADC according to an embodiment of the present invention.

FIG. 18B is a schematic representation of a physical layout 1850 of an ADC according to an embodiment of the present invention. The physical layout 1850 of the ADC includes a plurality of comparators 1800A-1800F repeated in the Y direction. Each block representing a comparator 1800A-1800F may represent a physical structure similar to that of comparator 1800 in FIG. 18A. In other words, transistors within each of the plurality of comparators 1800A-1800F may be arranged in a one-dimensional row in the X direction.

So as to not obscure the figure with too many lines, the labeled squares represent terminations and nodes rather than illustrating the interconnecting lines. For example, $V_{BP}$ and $V_{BN}$ represent bias voltages that may be input to each comparator 1800A-1800F. $V_{DD}$ is power, G is ground. $V_{IN}$ and $V_{REF}$ are the input signals to be compared. Vo is the primary output of each comparator, while $N_1$-$N_5$ and $P_1$-$P_5$ are additional outputs of neighboring comparators which may be coupled with primary outputs to form composite outputs for each comparator 1800A-1800F. For example, node $N_1$ may couple with a comparator located one position below the comparator in question. Node $N_2$ may couple with a comparator located two positions below the comparator in question, and so on. Similarly, nodes $P_1$-$P_5$ may couple with comparators located at positions above the comparator in question. To the far right, the composite output Vo may be further coupled to an additional stage (e.g., buffers, additional comparator string, encoder, etc.), which is indicated by arrow 1860. The additional stage 1860 may also have a physical layout with transistors aligned as described herein.

As the plurality of comparators 1800A-1800F are repeated in the Y direction, the individual transistors within the plurality of comparators 1800A-1800F may be arranged in columns relative to each other in the Y direction to form an array of transistors. Consequently, the regions of wasted space between individual comparators 1800A-1800F may be reduced, and matching between transistors may exist in both the X and Y directions. That is, the arrangement of rows of transistors may exist in the X direction for transistors of the same comparator (e.g., 1800A), while the arrangement of transistors in rows may exist in the Y direction for transistors of different comparators (e.g., 1800A-1800F). More or fewer individual comparators 1800A-1800F may exist depending on the desired resolution of the ADC.

A new analog-to-digital conversion method and ADC, called a Benorion Converter or Benorion ADC, has been designed and demonstrated herein that achieves a similarly fast conversion rate of a conventional bipolar flash converter. The Benorion ADC may have additional advantages, which may include at least one of reduced power dissipation, reduced silicon area consumption, similarly equivalent differential non-linearity, and reduced input capacitances. The Benorion ADC may further outperform other ADC methods for particularly desirable parameters including at least one of low power dissipation, small die size, high conversion rate, low conversion delay, differential non-linearity. For example, embodiments of the present invention may be used in applications in which one or more parameters such as relatively fast conversion rate (i.e., short latency), monotonic output, low cost, low input bias current, low input capacitance and low power dissipation may be desirable. While many advantages and benefits over conventional approaches have been described herein, not all advantages and benefits may be exhibited by every embodiment of the present disclosure. For example, embodiments of the invention may exist in which only one of the advantages is exhibited. Additionally, other advantages and benefits may also be exhibited by embodiments of the present disclosure in addition to, or instead of, those described herein.

Among the wide variety of applications in which such an ADC may be desirable, one specific example of such may include digital control loops, which may require relatively fast conversion rates and low power consumption, especially when part of a battery-powered portable device (e.g., cell phones, digital cameras, audio/video players, personal digital assistants, etc.). Other applications may include baseband applications, among many other applications.

While the present invention has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

What is claimed is:

1. A physical layout for an integrated circuit, the integrated circuit comprising:
   an analog-to-digital converter including a plurality of comparators, wherein each comparator of the plurality includes a differential amplifier coupled with at least one current mirror, and wherein individual transistors of each comparator of the plurality are arranged in a one-dimensional row in a first direction, and wherein neighboring comparators of the plurality of comparators are positioned relative each other in an abutting configuration in a second direction orthogonal to the first direction.

2. The physical layout of claim 1, wherein the analog-to-digital converter is a flash analog-to-digital converter.

3. The physical layout of claim 1, wherein the analog-to-digital converter is configured to weigh collective outputs of the comparators to form composite outputs.

4. The physical layout of claim 3, wherein the neighboring comparators of the plurality of comparators are inter-coupled.

5. The physical layout of claim 1, wherein the individual transistors are CMOS transistors.

6. The physical layout of claim 1, wherein the analog-to-digital converter further includes a plurality of serially-coupled resistors with nodes between individual resistors of the plurality being coupled with inputs of the individual comparators of the plurality, wherein the individual resistors of the plurality are arranged next to a corresponding individual comparator of the plurality in the first direction.

7. The physical layout of claim 6, wherein transistors of the differential amplifier are arranged with the same orientation.

8. The physical layout of claim 6, wherein transistors of the at least one current mirror are arranged in the same orientation.

9. The physical layout of claim 1, wherein each comparator of the plurality includes:
    a positive current mirror configured to generate at least one positive current output;
    a negative current mirror configured to generate at least one negative current output; and
    a primary comparator output that includes a combination of the at least one positive current output and the at least one negative current output.

10. The physical layout of claim 9, wherein at least one positive current output of one comparator is coupled to at least one of the negative current output of a neighboring comparator.

11. The physical layout of claim 9, wherein the primary comparator output is further coupled to at least one positive current output and at least one negative current outputs of one or more neighboring comparators of the plurality.

12. The physical layout of claim 1, wherein each comparator of the plurality further includes at least one bias transistor coupled with the differential amplifier pair.

13. A physical layout of an integrated circuit, the integrated circuit, comprising:
    a plurality of rows of transistors forming a two-dimensional array of transistors, each of the plurality of rows including transistors arranged in a one-dimensional row in a first direction, wherein each of the individual rows of transistors includes a bias transistor coupled with a differential amplifier pair that is configured to perform a comparator function of an input signal and a reference signal.

14. The physical layout of claim 13, wherein each row of the plurality of rows includes a plurality of output lines, wherein each row of the plurality is configured to generate currents on the respective plurality of output lines, wherein a current direction of at least one individual output line of the plurality is different than a direction of at least one other individual output line of the plurality.

15. The physical layout of claim 13, wherein at least one output line of a row of the plurality is coupled with at least one other output line of another row of the plurality to generate at least one composite output line.

16. The physical layout of claim 13, wherein the transistors of the two-dimensional array are arranged in columns in a second direction orthogonal to the first direction, wherein transistors positioned within a same column perform a similar function for their respective rows.

17. The physical layout of claim 16, wherein the transistors of each row of the plurality are configured with a substantially similar layout.

18. The physical layout of claim 17, wherein transistors of each row of the plurality have the same orientation as a transistor within the same column of a neighboring row.

19. The physical layout of claim 13, wherein the transistors of each row have gates that are aligned with gate widths oriented in the first direction.

20. The physical layout of claim 13, wherein each of the individual rows of transistors further includes at least one current mirror coupled with a differential amplifier pair.

21. A method for fabricating an integrated circuit, the method comprising:
    arranging transistors of a first comparator including at least one current mirror in a one-dimensional row in a first direction;
    arranging transistors of at least one additional comparator including at least one additional current mirror in another one-dimensional row in the first direction; and
    arranging transistors of the first comparator and the at least one additional comparator relative to each other in a second direction orthogonal to the first direction.

22. The method of claim 21, wherein the first comparator and the at least one additional comparator are substantially identical.

23. The method of claim 21, wherein arranging transistors in a one-dimensional row in a first direction includes:
    matching a differential amplifier pair within the first comparator; and
    matching another differential amplifier pair within the at least one additional comparator.

24. The method of claim 21, wherein arranging transistors in a one-dimensional row in a first direction includes:
    matching transistors of the at least one current mirror within the first comparator; and
    matching transistors of the at least another current mirror within the at least one additional comparator.

25. The method of claim 21, wherein arranging transistors in a second direction includes matching neighboring differential amplifier pairs and neighboring current mirrors of the one-dimensional row and the another one-dimensional row in the second direction.

26. The method of claim 21, wherein arranging transistors in a one-dimensional row in a first direction includes aligning a plurality of gates of the transistors, wherein the plurality of gates of the transistors are oriented with gate widths in the first direction.

27. The method of claim 21, further comprising inter-coupling outputs of the first comparator and the at least one additional comparator.

28. The method of claim 21, further comprising:
    arranging a bias transistor within the one-dimensional row of the first comparator; and
    arranging another bias transistor within the another one-dimensional row of the at least one additional comparator.

* * * * *